US007783997B1

(12) United States Patent
Vanspauwen

(10) Patent No.: US 7,783,997 B1
(45) Date of Patent: Aug. 24, 2010

(54) LARGE SCALE FINITE STATE MACHINES

(75) Inventor: Niels Vanspauwen, Heverlee (BE)

(73) Assignee: Synopsys, Inc., Mountain View, CA (US)

( * ) Notice: Subject to any disclaimer, the term of this patent is extended or adjusted under 35 U.S.C. 154(b) by 278 days.

(21) Appl. No.: 10/937,645

(22) Filed: Sep. 8, 2004

Related U.S. Application Data

(60) Provisional application No. 60/592,650, filed on Jul. 30, 2004.

(51) Int. Cl.
*G06F 17/50* (2006.01)
(52) U.S. Cl. ............................................. 716/3; 716/18
(58) Field of Classification Search .................. 716/18, 716/3
See application file for complete search history.

(56) References Cited

U.S. PATENT DOCUMENTS

| | | | | |
|---|---|---|---|---|
| 5,301,100 A | | 4/1994 | Wagner ....................... 364/148 |
| 5,513,122 A | | 4/1996 | Cheng et al. ................. 364/489 |
| 5,706,205 A | * | 1/1998 | Masuda et al. ................. 716/18 |
| 5,774,370 A | * | 6/1998 | Giomi ............................ 716/4 |
| 5,822,514 A | | 10/1998 | Steinz et al. ........... 395/185.02 |
| 5,870,590 A | | 2/1999 | Kita et al. ....................... 716/4 |
| 6,038,378 A | * | 3/2000 | Kita et al. ..................... 714/38 |
| 6,074,428 A | | 6/2000 | Petler ............................ 716/2 |
| 6,094,151 A | | 7/2000 | Schwartz et al. ............. 341/107 |
| 6,141,633 A | | 10/2000 | Iwashita et al. ............... 703/15 |
| 6,182,268 B1 | | 1/2001 | McElvain et al. .............. 716/1 |
| 6,192,505 B1 | | 2/2001 | Beer et al. ...................... 716/2 |
| 6,253,112 B1 | | 6/2001 | Flora-Holmquist et al. ... 700/19 |
| 6,421,815 B1 | | 7/2002 | Seawright ....................... 716/7 |
| 6,487,704 B1 | | 11/2002 | McNamara et al. ............ 716/5 |
| 6,628,660 B1 | | 9/2003 | Morse ..................... 370/395.7 |
| 6,668,199 B1 | | 12/2003 | Arcidiacono et al. .......... 700/12 |
| 6,694,290 B1 | | 2/2004 | Apfelbaum et al. ........... 703/22 |
| 6,711,728 B1 | | 3/2004 | Otsubo ........................ 716/18 |
| 6,920,583 B1 | * | 7/2005 | Morley et al. ................. 714/32 |
| 6,968,291 B1 | | 11/2005 | Desai ......................... 702/182 |
| 2002/0023256 A1 | * | 2/2002 | Seawright .................... 716/18 |
| 2003/0065505 A1 | | 4/2003 | Johnston et al. |
| 2004/0059443 A1 | * | 3/2004 | Sharangpani ................ 700/48 |
| 2005/0160404 A1 | * | 7/2005 | Nachmanson et al. ....... 717/124 |

OTHER PUBLICATIONS

"Finite State Machine," Free On-Line Dictionary of Computing, http://foldoc/foldoc.cgi?query=finite+state+machine, Sep. 22, 2001.
"State Explosion", Embedded Software Design Automation Glossary, http://web.archive.org/web/20021025140630//http:www.reactive-systems.com/esda-glossary.msp,2002.
Wolf, "An Algorithm for Nearly-Minimal Collapsing of Finite-State Machine Networks", IEEE, 1990.
Knudsen; et al. "Simulated Evolution in a Linguistic Model", 2000 Overseas Publishers Association, NY.

* cited by examiner

*Primary Examiner*—Jack Chiang
*Assistant Examiner*—Suresh Memula

(57) ABSTRACT

Large-scale finite state machines. An implementation is a method of splitting FSMs in which a dataflow graph is accessed that represents an expression. A cost analysis of computing sub-expressions of the expression corresponding to subsets of the dataflow graph is performed. Based on the cost analysis, the dataflow graph is split into separate dataflow graphs. A finite state machine is determined for each of the dataflow graphs.

20 Claims, 27 Drawing Sheets

650

700

1700

LARGE SCALE FINITE STATE MACHINES

RELATED APPLICATION

This Application claims priority to U.S. Provisional Application entitled, "LARGE SCALE FINITE STATE MACHINES," Application No. 60/592,650, filed on Jul. 30, 2004, which application is hereby incorporated by reference. This application is related to co-pending, commonly-owned U.S. patent application Ser. No. 10/937,161, filed Sep. 8, 2004, entitled "OUTPUT PARTITIONING OF LARGE-SCALE FINITE STATE MACHINES" to VanSpauwen; and co-pending, commonly-owned U.S. patent application Ser. No. 10/937,068, filed Sep. 8, 2004, entitled "DETERMINING LARGE-SCALE FINITE STATE MACHINES USING CONSTRAINT RELAXATION" to VanSpauwen.

FIELD OF THE INVENTION

Embodiments of the present invention relate to the field of software tools to facilitate designing computer architecture. Specifically, embodiments of the present invention relate to computer-implemented techniques to create and modify large-scale finite state machines that may be used in modeling and simulating computer architectures.

BACKGROUND ART

Recently a new tool has been developed that dramatically improves the process of designing computer architecture. The BusCompiler™ tool (which is commercially available from CoWare™ Corporation of San Jose, Calif.) is a tool that facilitates the design and development of computer bus architectures. The BusCompiler™ tool inputs a file containing a formal protocol (e.g., input specification) that describes a bus architecture being designed and outputs a model of the bus architecture, which may be used to simulate the bus architecture. The input specification may comprise a number of expressions that are solved in order to simulate the bus architecture. The expressions may comprise mathematical operators and may include Boolean variables and operators.

Thus, a design engineer may create an input specification that comprises a number of expressions that describe characteristics of a computer architecture/logic for which a model or simulation is desired. The design engineer does not specify FSMs in the input specification. Based on the input specification, the BusCompiler™ tool creates and outputs a computer executable file that may be used to simulate the computer architecture being designed. The computer executable file comprises finite state machines (FSMs), which are automatically generated by the BusCompiler™ tool and which can be very large scale. Further, the complexity of the FSMs can grow exponentially as the complexity of the computer architecture/logic that is the subject of the model increases. Finite state machines are also used to design other computer architectures and logic.

SUMMARY OF THE INVENTION

Therefore, it would be advantageous to provide techniques that allow complex computer architectures and logic to be modeled and simulated. It would be further advantageous to provide techniques to manage the size of FSMs. It would be still further advantageous to provide techniques that efficiently create computer executable code, such as FSMs used in simulations of computer architectures. It would be still further advantageous to provide computer executable code that allow simulations of computer architectures to execute efficiently.

Accordingly, embodiments of the present invention provide methods and systems that allow complex computer architectures and logic to be modeled and simulated. Embodiments of the present invention provide methods and systems to manage (e.g., reduce) the size of FSMs. Embodiments of the present invention methods and systems that efficiently create computer executable code used in simulations of computer architectures. Embodiments of the present invention provide methods and systems that provide computer executable code that allow simulations of computer architectures to execute efficiently.

An embodiment of the present invention is a computer-implemented method of splitting FSMs into smaller FSMs. The splitting may be based on computer-implemented heuristics. Such splitting allows complex computer architecture to be modeled and simulated because it decreases the overall size of all of the FSMs used in the modeling and simulation of the entire complex computer architecture. In this embodiment, a dataflow graph is accessed that represents an expression. A cost analysis of computing sub-expressions of the expression corresponding to subsets of the dataflow graph is performed. Based on the cost analysis, the dataflow graph is split into separate dataflow graphs. A finite state machine is determined for each of the dataflow graphs.

In another embodiment, the finite state machines created by the preceding embodiment are combined during simulation by using an output of a first of the finite state machines as an input for a second of the finite state machines.

Systems in accordance with embodiments of the present invention are also described herein.

Embodiments of the present invention provide these advantages and others not specifically mentioned above but described in the sections to follow.

BRIEF DESCRIPTION OF THE DRAWINGS

The accompanying drawings, which are incorporated in and form a part of this specification, illustrate embodiments of the invention and, together with the description, serve to explain principles of embodiments of the invention.

DETAILED DESCRIPTION OF THE INVENTION

Figure 1:
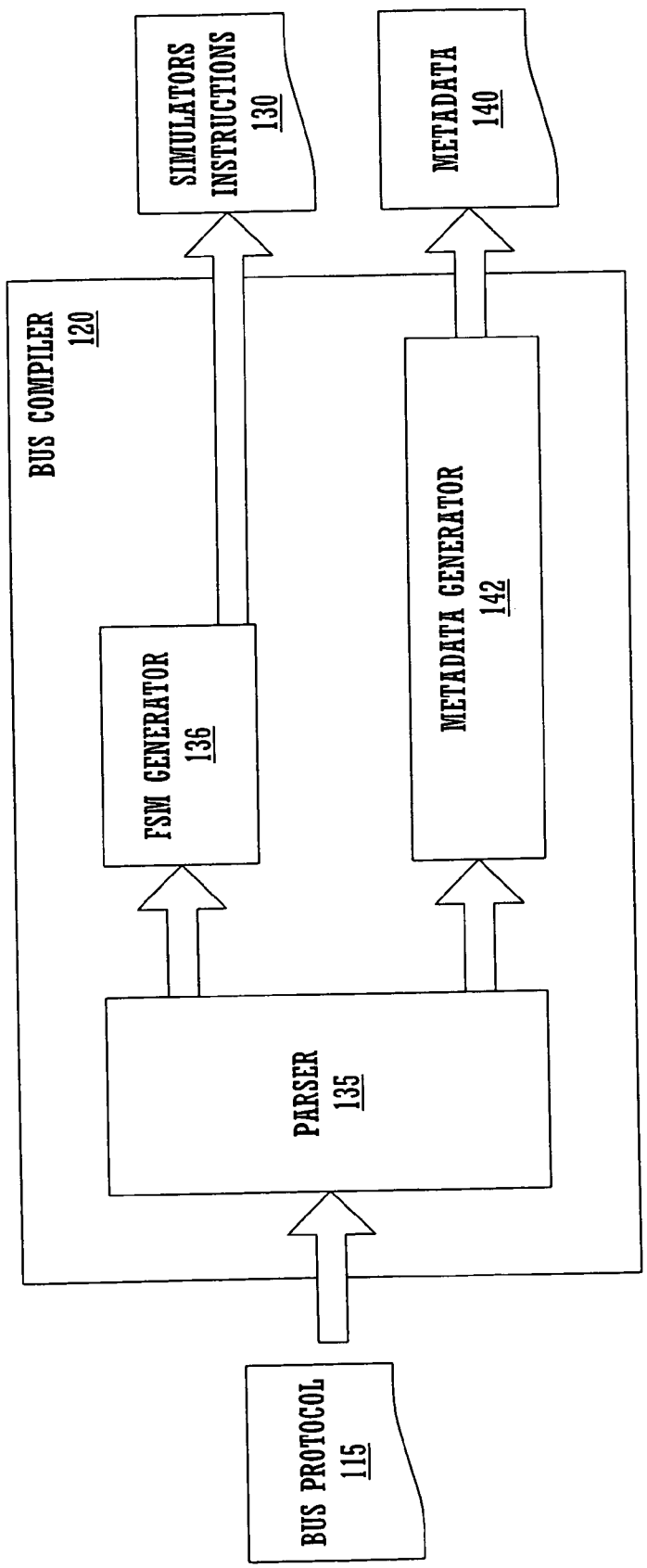
FIG. 1 is a block diagram of components of a bus compiler tool, according to an embodiment of the present invention.

In the following detailed description of embodiments of the present invention, large-scale finite state machines, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "eliminating" or "generating" or "outputting" or "computing" or "translating" or "calculating" or "determining" or "partitioning" or "returning" or "analyzing" or "accessing" or "annotating" or "simulating" or "combining" or "splitting" or "performing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In order to model and simulate complex computer architectures, embodiments of the present invention access a specification (otherwise known as a formal protocol) that describes a computer architecture for which a model or simulation is desired and create computer executable code that facilitate that simulation. From the input specification, a number of FSMs are created by embodiments of the present invention. The FSMs calculate outputs of the expressions from the input specification when the FSMs are integrated into a simulation program.

FIG. 1 is a block diagram of components of a bus compiler tool 120, according to an embodiment of the present invention. The bus compiler tool 120 may be implemented on a general-purpose computer system, such as the computer system 100 depicted in FIG. 16. An input to the bus compiler tool 120 is a description 115 of a bus protocol. The bus compiler tool 120 outputs transactional level bus simulation instructions 130 and a metadata bus description 140. The transactional level bus simulation instructions 130 may be used for architecture exploration, testing, and verification. The metadata bus description 140 may be used to facilitate the aforementioned architecture exploration, testing, and verification. However, the metadata bus description 140 is not a required output of the bus compiler 120.

The bus compiler tool 120 may be described as comprising a number of logical components, which will be described in more detail below. Briefly, the parser 135 reads the input formal bus protocol description 115 and converts it to a format that is suitable for other components of the bus compiler tool 120. The FSM generator 136 receives an output from the parser 135 and produces FSMs based thereon. The metadata description generator 142 generates the metadata bus description 140 from an output of the parser 135. The metadata description generator 142 is not a required component of the bus compiler tool 120.

The input formal bus protocol description 115 may be written by a user and may contain temporal expressions, which can describe temporal relationships between events. Temporal expressions are widely known to those of ordinary skill in the art. The input formal bus protocol description 115 may be a general description of the formal bus protocol. For example, the formal bus protocol description 115 may describe the nodes that are part of a family of busses, along with protocol and timing information. However, the formal bus protocol description 115 does not necessarily specify the exact number of master/slaves, the precise topology, the exact memory map, complete arbitration algorithms, etc. This means that the transactional level bus simulation instructions 130 generated by the bus compiler 120 comprises instructions that are general in nature, such that the bus design may be refined by the user during exploration, verification, and testing. The formal bus protocol description 115 may be a text file or a graphical description. The parser 135 may be designed to be able to parse formal bus protocol descriptions 115 in a textual format, a graphical format, or another format.

As previously discussed, the bus compiler tool 120 outputs two files 130, 140, in this embodiment. One file is a transactional level bus simulation instructions 130 of the bus. The transaction level may be described as an abstraction away from the physical hardware (e.g., MUXes, registers, electrical connections) up to a level at which transactions over the bus are considered. The transactional level bus simulation instructions 130 may be used by another tool (not depicted in FIG. 1) to explore the architecture. For example, the Platform Creator Tool™, commercially available from CoWare™ of San Jose, Calif. may be used to simulate a bus by inputting the transactional level bus simulation instructions 130. The transactional level bus simulation instructions 130 may be substantially compliant with the SystemC programming language, although other programming languages are also suitable for the transactional level bus simulation instructions 130.

As previously mentioned, the formal bus protocol description 115 that is an input to the bus compiler tool 120 may be a text file, although the formal bus protocol description 115 does not have to be a text file. The present invention is not limited to any specific language in which to describe the text file formal bus protocol description. Moreover, the present invention is not limited to the formal bus protocol description 115 being a text file.

Figure 2:
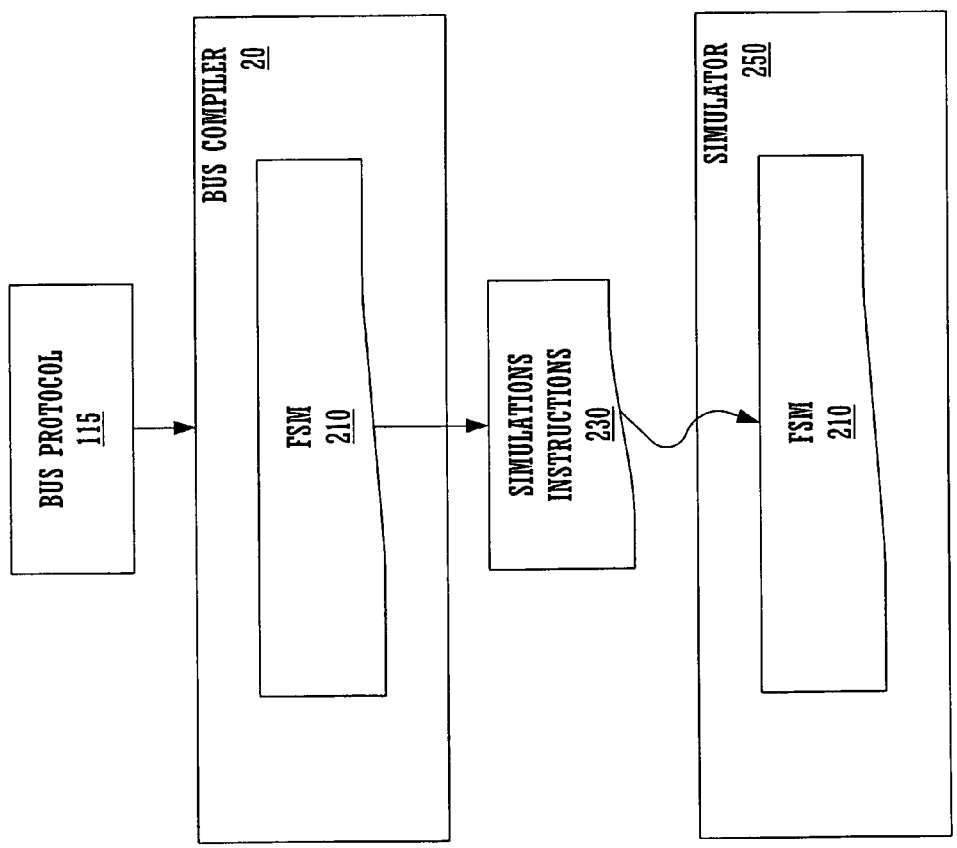
FIG. 2 is block diagram illustrating a conventional finite state machine generation.

FIG. 2 is block diagram illustrating relationships between FSMs and an input specification, in accordance with a conventional technique. In the conventional technique, the conventional bus compiler 20 creates a single FSM 210 from the input specification 115 and outputs it as part of the simulation instructions 230. The simulation instructions 230 are input to the simulator 250. Executing the simulation with a single very large FSM 210 can be a very efficient way to run the simulation. However, the extremely large scale of the FSM needed for complex computer architectures can present problems. The creation of the single FSM involves implicit multiplication of individual FSMs, each of which represents an input expression. For example, the bus protocol 115 is divided into many expressions. Implicitly multiplying the various FSMs together to create a single FSM results in state explosion and hence an extremely large FSM. The extremely large scale of the FSM presents computational challenges within the bus compiler tool 20. Moreover, it is possible that the single FSM is so large that the resources of the computer system that serves as the platform for the bus compiler 20 are inadequate to compute the FSM.

Splitting FSM Based on Output Partitioning

Figure 3:
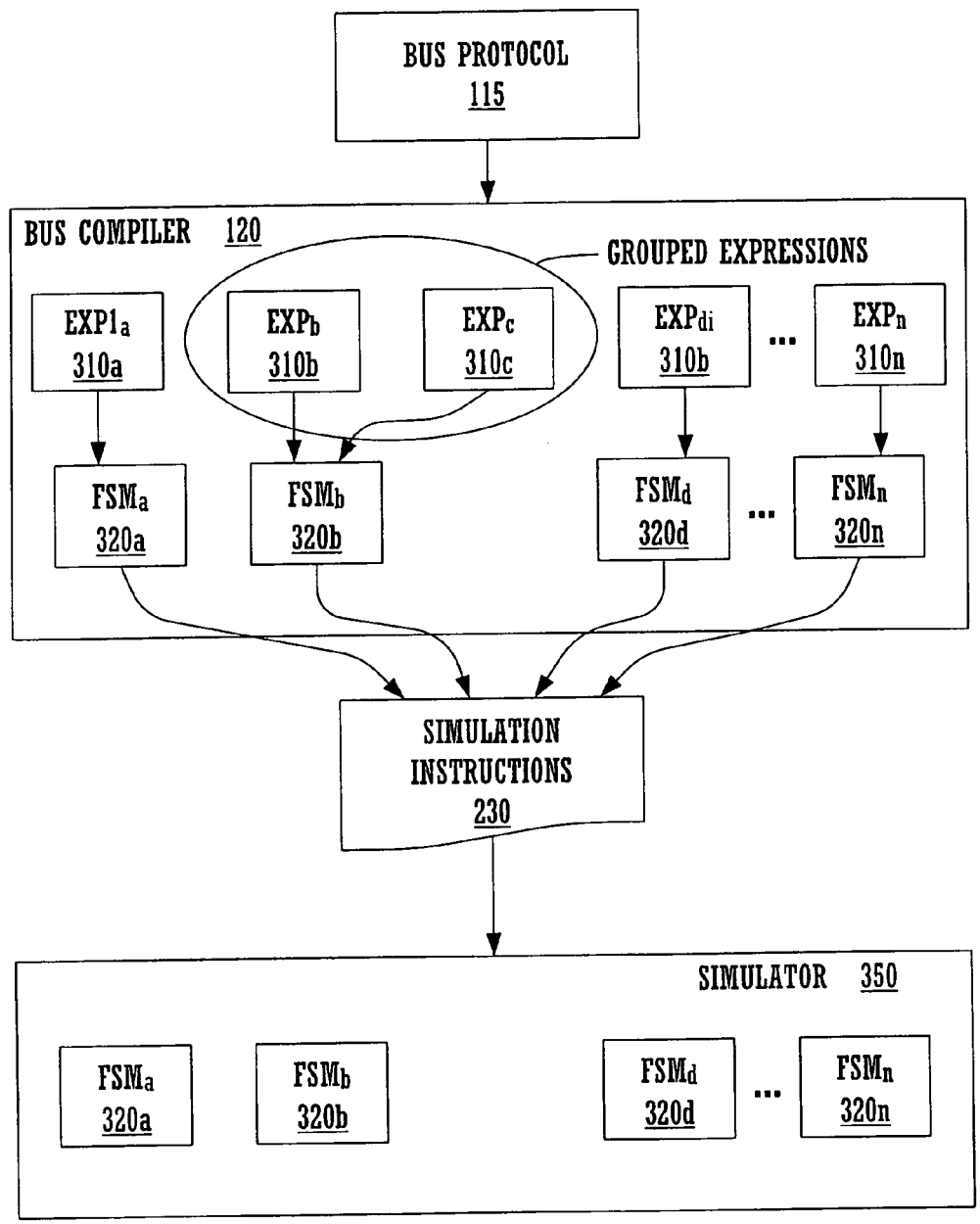
FIG. 3 is block diagram illustrating relationships between FSMs and an input specification, in accordance with an embodiment of the present invention.

An embodiment of the present invention allows for simulation of complex architectures by creating multiple FSMs for the input specification (e.g., bus protocol) with some of the FSMs computing multiple outputs. This embodiment selects the outputs that will be computed with a single FSM such that explosion of states in the FSM is avoided. FIG. 3 is block diagram illustrating relationships between FSMs and expressions derived from an input specification, in accordance with an embodiment of the present invention. The bus compiler 120 of the present embodiment accesses a bus protocol 115 (e.g., input specification). The bus compiler 120 analyzes the input specification to determine what outputs are needed for the given input specification. The bus compiler 120 creates an expression 310a-310n for each of the needed outputs. The bus compiler 120 could at this point create a FSM for each expression. In other words, the bus compiler 120 could create a FSM for each output.

However, in accordance with this embodiment, the bus compiler 120 then groups certain outputs together. A FSM 320a, 320b, 320d-320n is then created for the expressions, with some FSMs representing multiple expressions. For example, expressions 310b and 310c are both represented by FSM 310b. This allows fewer FSMs 310 to be created than if a separate FSM were used for each expression. Moreover, this embodiment avoids that state explosion that occurs if a single FSM were used for all of the expressions (e.g., expression 320a-320n).

The bus compiler 120 outputs the FSMs 320, which may be stored on a computer readable medium as part of the simulation instructions 130. For example, the bus compiler 120 outputs SystemC code that may be stored on a computer readable medium. Other computer code and data structures may also make up the simulation instructions 130. The bus compiler 120 may also output metadata (not depicted in FIG. 3). The simulation instructions 130, comprising the FSMs 320 are input to the simulator 350, which may multiply the FSMs 120 when the simulation is executed. By using a single FSM to compute the output of selected multiple expressions, this embodiment computes and compiles the FSMs in the bus compiler 120 much faster than the conventional technique depicted in FIG. 2. Further, the output of the bus compiler 120, which may be C++ files, is reduced in size. Moreover, grouping some of the expressions together (in a single FSM) helps to avoid state explosion, which may allow the simulation to execute more efficiently.

Figure 4:
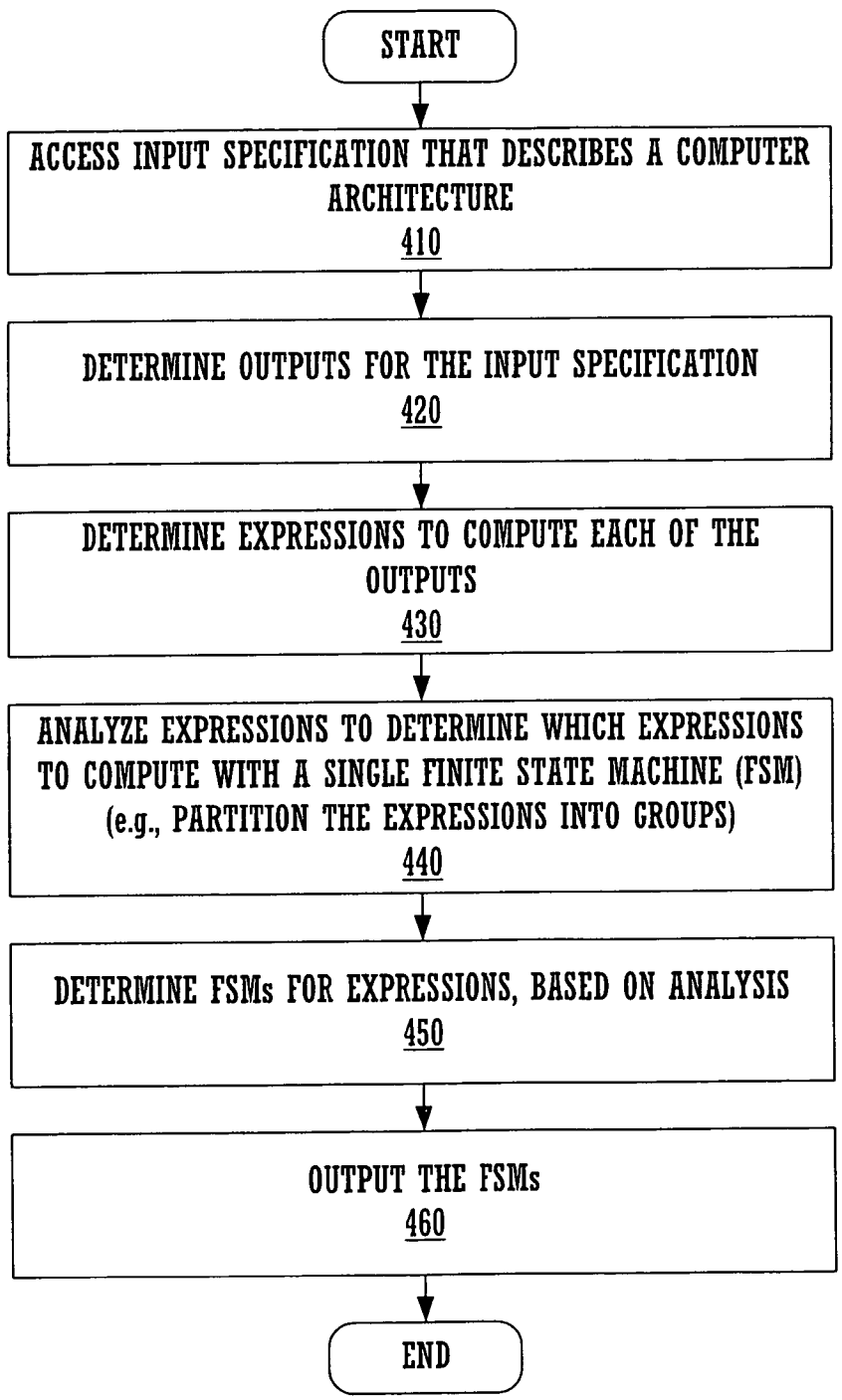
FIG. 4 is flowchart illustrating steps of a process of splitting a FSM based on output partitioning, in accordance with an embodiment of the present invention.

FIG. 4 is flowchart illustrating a computer-implemented process of splitting a FSM based on output partitioning, in accordance with an embodiment of the present invention. Steps of process 400 may be stored as instructions on a computer readable medium and executed on a processor. Process 400 produces computer data structures that may be stored on a computer readable medium. The data structures may be input to a software tool, such as Platform Creator Tool™, such that a simulation of a computer architecture is achieved. In step 410, an input specification that describes a computer architecture is accessed.

In step 420, outputs for the input specification are determined. The input specification does not necessarily have the outputs explicitly defined. For example, a design engineer who wrote the input specification does not necessarily explicitly define the outputs.

In step 430, expressions are determined to compute each of the outputs. A dataflow graph can be created for each expression. The dataflow graph contains information about inputs, outputs, intermediate variables, and state variables. The information in the dataflow graph can be used to determine what a FSM would look like if it were to be created. Delay expressions of other outputs are not state variables, in one implementation. Rather, they are modeled as inputs to the FSM. It may also be observed that some outputs are purely combinatorial and hence yield FSMs with no state variables and only a single state.

In step 440, the expressions are analyzed to determine which expressions can be computed by a single FSM. For example, the expressions are partitioned into groups of expressions, wherein a single FSM is used to compute all of the outputs for all expressions in a given group. A set of adjustable rules may be applied in the analysis. For the sake of illustration, given two outputs O1 and O2, IS1 may be defined as the set of inputs used by the expression that defines O1, SVS1 as the set of state variables used by the expression that defines O1, and ISVS1 as the set of inputs used by the SVS1. Similar definitions of IS2, SVS2, ISVS2 can be used for O2.

It would be possible to compute the outputs O1 and O2 by separate FSMs. However, step 440 applies a heuristic to determine which outputs can be computed by a single FSM. Using the notation described in step 440, the outputs O1 and O2 can be computed by a single FSM if any of the following rules hold:

1. IS1 is substantially identical to IS2 and SVS1 is substantially identical to SVS2.
2. IS1 is a subset of IS2 and SVS1 is a subset of SVS2.
3. ISVS1 is substantially identical to ISVS2.

Rule 1 implies that the separate FSMs to compute O1 and O2 would be substantially identical. For example, if the state variables and the inputs of the two output expressions are substantially identical, then the states and transitions of the respective FSMs will be substantially the same. However, temporary variables used by the respective FSMs may be different. However, as this embodiment is concerned with outputs, the differences in temporary variables can be ignored. Rule 2 implies that the FSM that computes O1 would be a subset of the FSM that computes O2. Hence, the smaller FSM need not be computed. Rule 3 implies that the FSM that computes O1 and the FSM that computes O2 are likely to be very similar FSMs. The similarity can be taken advantage of by using just one FSM to compute both outputs, wherein computational resources are reduced.

The preceding rules are exemplary in that other rules could be used instead of or in addition to these rules. It is not required that any of the above rules need be applied. Furthermore, rules may be configurable, so that the user can choose rules in accordance with user desires. For example, it may be possible that different heuristics work better for certain types of busses. Therefore, the user can adjust the rules in accordance with one embodiment.

In step 450, finite state machines are determined for the expressions. For some of the expressions, a single FSM is determined. If a single FSM is used for multiple expressions (e.g., multiple outputs) then each output is annotated on the FSM. Other expressions lead to a separate FSM for each expression. State variables and inputs for the FSMs are inferred by examining the expressions that define that output.

In step 460, the FSMs are output and may be stored on a computer readable medium. The FSMs may be input to a simulation tool to simulate the computer architecture that was the subject of the input specification. During execution of the simulation, the FSMs produce the same output values as the single, multiplied FSM would, such that the input specification is modeled and simulated.

As a refinement to process 400, a cost function can be applied to determine which partitioning to use. For example, a cost function that balances memory versus simulation performance can be applied. Because the cost function can be calculated relatively quickly, all possible partitioning can be enumerated with the partitioning with the lowest cost being used. The memory requirements may be estimated by computing the maximum possible number of combinations that can be expressed by a given set of state variables. For example, if n=number of bits of all state variables, the memory cost of a single FSM can be estimated by $2^n$. Therefore, the total memory cost of a given partitioning is the sum of the memory costs of each of the FSMs in the partitioning. For FSMs with only a single state and no state variables (as is the case for purely combinatorial outputs), n will be 0. However, such a FSM may be assigned an infinite memory cost. The simulation performance is largely determined by the number of inputs a FSM has. The more inputs an FSM has, the slower it will simulate, in general.

Determining multiple FSMs with at least some FSMs computing multiple outputs instead of computing one very large scale FSM allows modeling of very complex busses because it decreases computer resources needed to compute and store the computed state machine. Process 400 may be described as computing one FSM per output and combining FSMs that are very similar to make a trade-off between FSM size and simulation speed. It will be understood that the combining may take place before the FSM is actually computed.

Exemplary Partitioning Case

The following example of output partitioning is provided for illustrative purposes. In this example, the input specification has four Boolean inputs: I1, I2, I3 and I4. Furthermore, the input specification has the one state variable SV defined as: SV=delay(I2). Moreover, outputs O1 through O6 are defined as:

O1=I1 or I2
O2=I1 or I2
O3=I1 or SV
O4=SV
O5=I3
O6=I4 and I3

Figure 5:
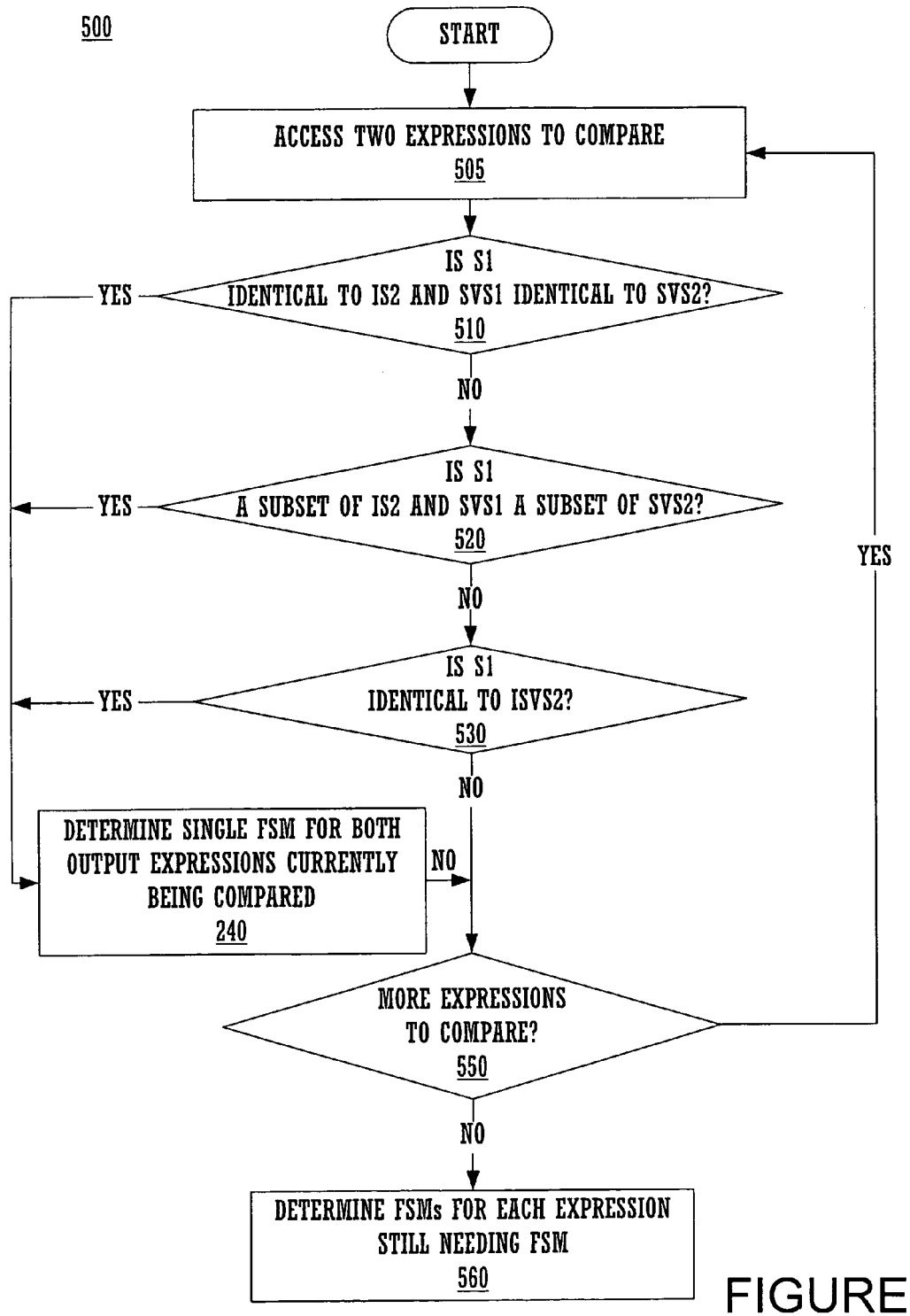
FIG. 5 is flowchart illustrating steps of a process of rules of splitting a FSM based on output partitioning, in accordance with an embodiment of the present invention.

FIG. 5 is flowchart illustrating a computer-implemented process 500 of rules of splitting a FSM based on output partitioning, in accordance with an embodiment of the present invention. Process 500 may be used to implement steps 440 and 450 of process 400 of FIG. 4. However, steps 440 and 450 of process 400 of FIG. 4 are not limited to process 500. Process 500 will be explained using the preceding exemplary input specification. In step 505, two input expressions are accessed for comparison per steps 510-530.

In step 510, inputs and state variables of the two expressions are compared to determine if a single FSM should be used to compute both outputs of the two respective expressions. Thus, given the notation above, the test of step 510 can be expressed as: "IS1 is identical to IS2 and SVS1 is identical to SVS2." Given the expressions for the outputs above, step 510 determines that only one FSM should be used to compute both O1 and O2 (IS1=IS2={I1, I2}, SVS1=SVS2={ }).

Figure 6A:
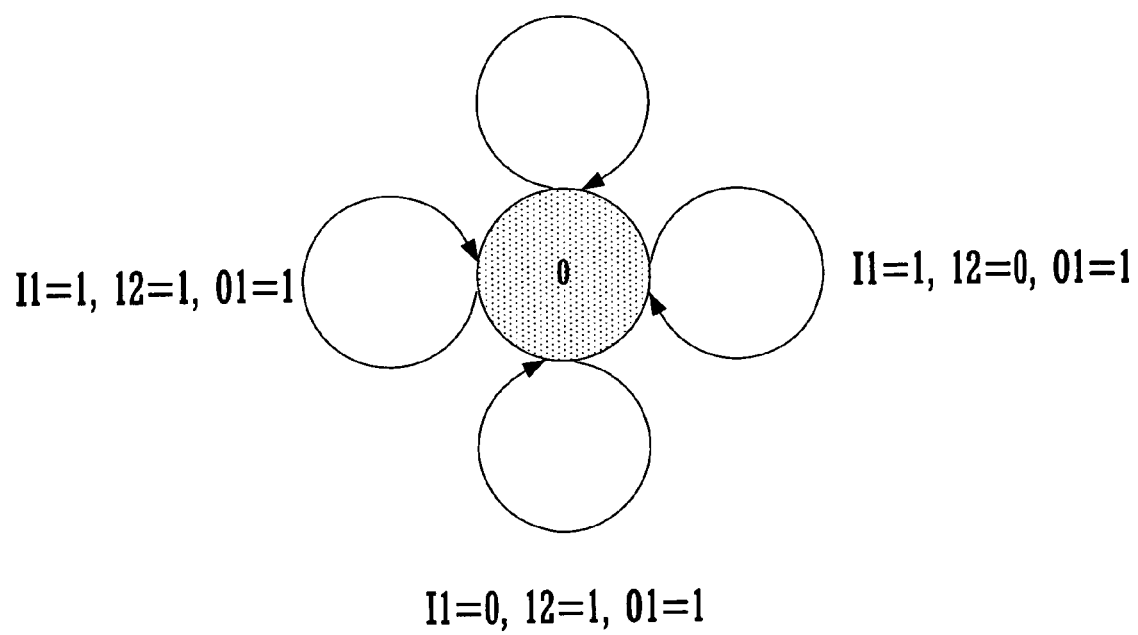
FIG. 6A and FIG. 6B are diagrams illustrating FSMs for computing two different outputs.
Figure 6B:
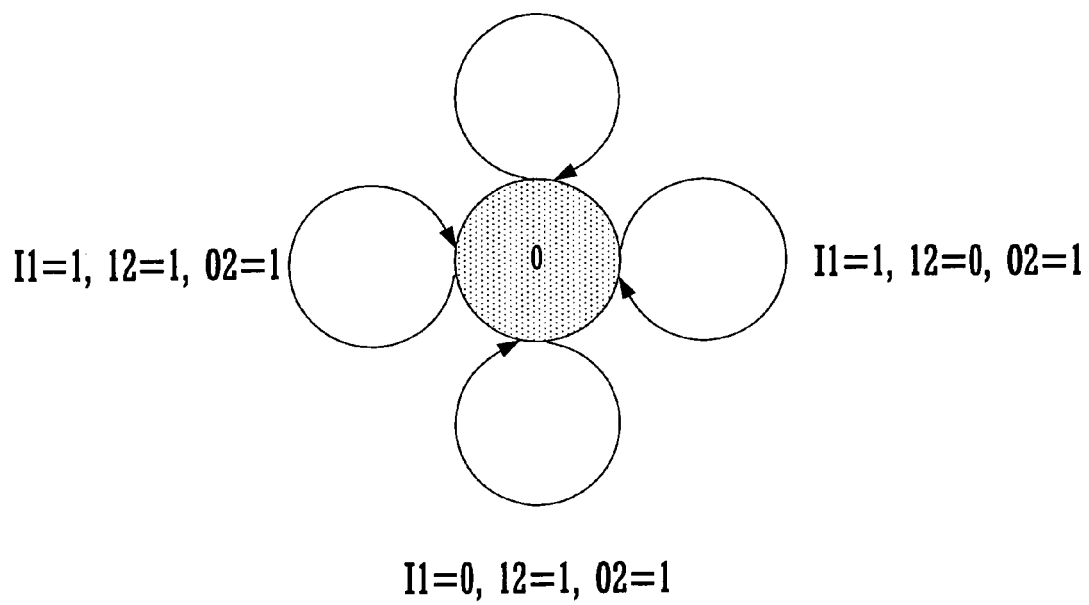
Figure 6C:
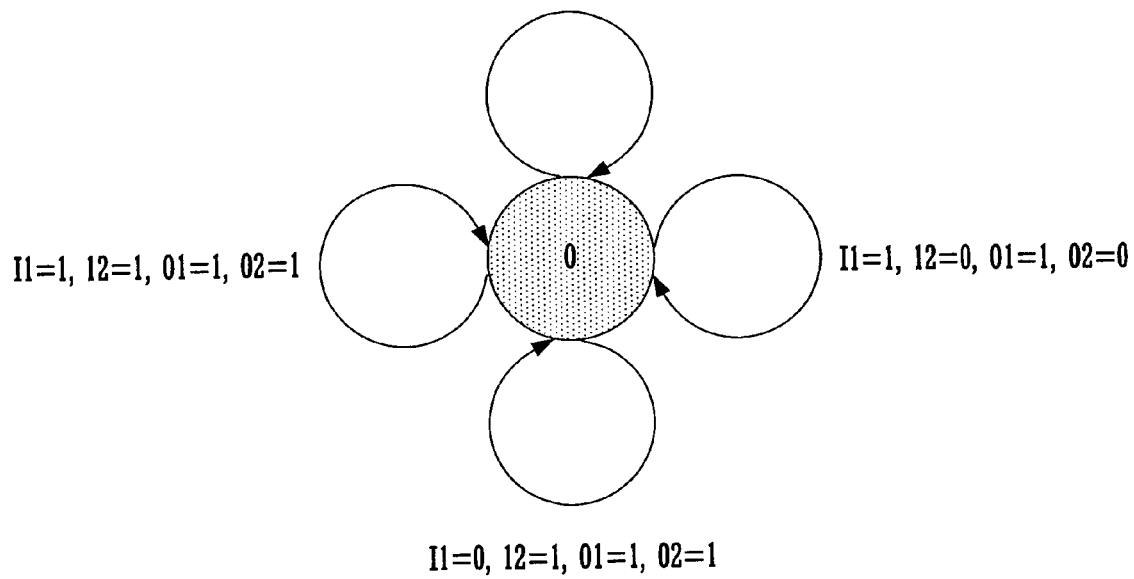
FIG. 6C is a diagram illustrating a single FSM for computing both outputs of the FSMs of FIG. 6A and FIG. 6B, in accordance with an embodiment of the present invention.

If a single FSM is to be computed, process 500 computes the single FSM in step 540. For example, if the two expressions currently being compared are those for computing outputs O1 and O2, then the FSMs for those separate expressions would be as illustrated as the FSM 600 in FIG. 6A and the FSM 650 of 6B. As the test in step 510 indicates, these FSMs are identical apart from the annotation of the values of O1 and O2 on the transitions. FIG. 6C illustrates the FSM used to compute both outputs O1 and O2, in accordance with this embodiment of the present invention. The two FSMs of FIGS. 6A and 6B would require computing two states and eight transitions. However, the single FSM 680 of FIG. 6C computes only one state and four transitions. Thus, in this case, the number of states and transitions used by the combined FSM of FIG. 6C is equal to either of the separate FSMs of FIGS. 6A and 6B.

If a step 510 fails to conclude that the two expression being compared should be computed with a single FSM, process 500 proceeds to step 520 to determine if the two expressions should be computed with a single FSM based on the test of step 520.

In step 520, the condition tested for is whether the Boolean inputs for a first of the outputs are a subset of the Boolean inputs of a second output and whether the state variables used by the expression that defines the first output is a subset of the state variables used by the expression that defines the second output. Thus step 520 implies that a FSM computing the first output would be a subset of the FSM computing the second output.

Figure 7A:
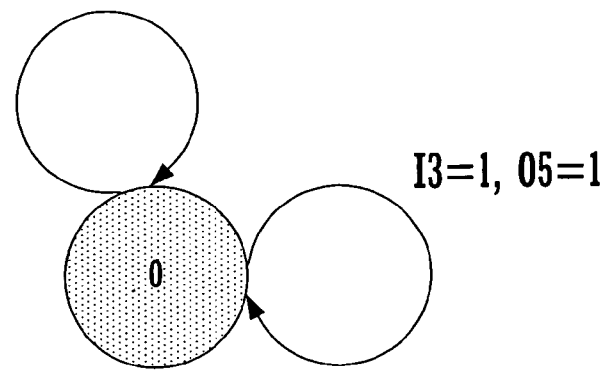
FIG. 7A and FIG. 7B are diagrams illustrating FSMs for computing two different outputs.
Figure 7B:
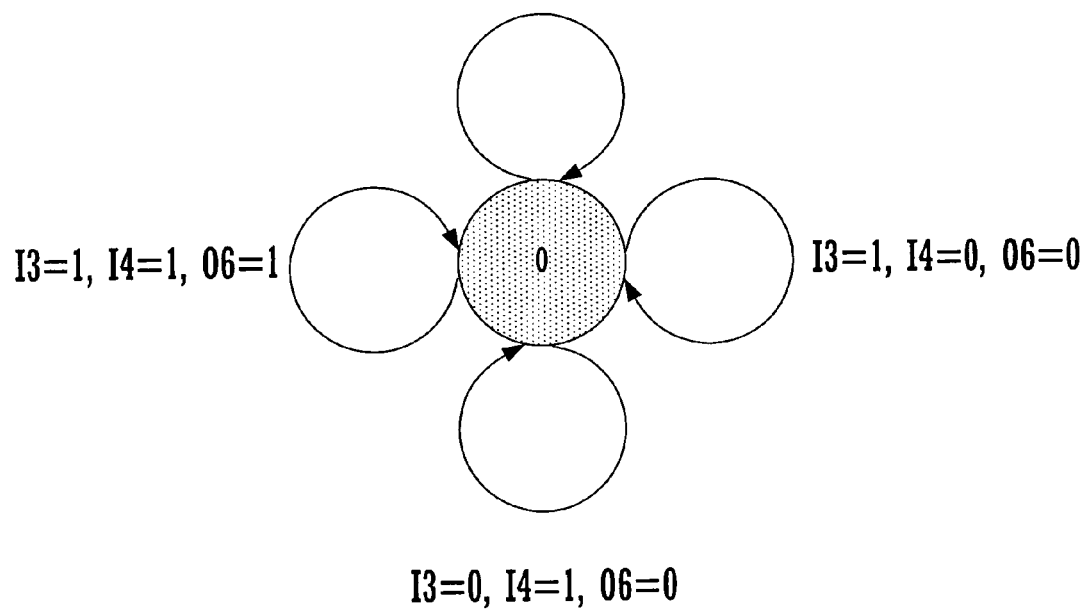
Figure 7C:
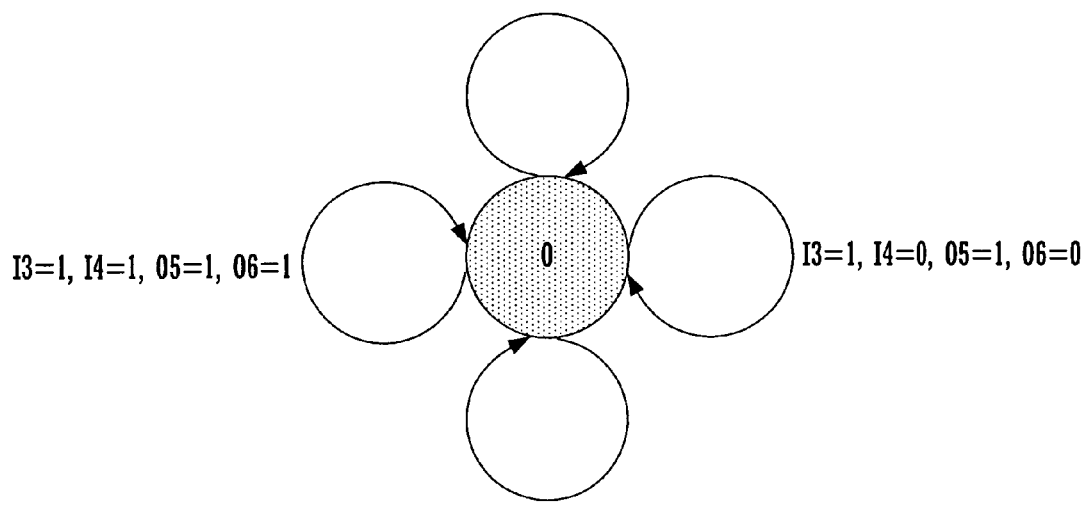
FIG. 7C is a diagram illustrating a single FSM for computing both outputs of the FSMs of FIG. 7A and FIG. 7B, in accordance with an embodiment of the present invention.

If a single FSM is to be computed, process 500 computes the single FSM in step 540. For the sake of illustration now consider that the two expressions currently being compared are those for computing outputs O5 and O6. The FSMs for those separate expressions would the FSM 700 in FIG. 7A and the FSM 720 in FIG. 7B. However, applying the rule of step 520 to the output expressions above leads to the conclusion that a single FSM can be used to compute both O5 and O6 (IS5={I3}, IS6={I3, I4}, SVS5=SVS6={ }). FIG. 7C represents the FSM 750 for computing the outputs O5 and O6 with a single FSM 750, in accordance with this embodiment of the present invention. Thus, instead of computing two states and six transitions, as depicted in FIGS. 7A and 7B, only one state and four transitions are computed in the combined FSM 750 of FIG. 7C. This rule guarantees that the number of states and transitions needed by the combined FSM 750 is equal to the largest of the separate FSMs. If step 520 fails to conclude that a single FSM is to be computed for the current expressions being evaluated, process 500 proceeds to step 530 to test the next rule.

In step 530, a determination is made as to whether the set of inputs used by the state variables of a first output are identical to the set of inputs used by the state variables of a second output. The test of step 530 determines whether the FSM computing the first output and the FSM computing the second output are likely to be very similar FSMs.

If a single FSM is to be computed, process 500 computes the single FSM in step 540. For example, if the two expressions currently being compared are those for computing outputs O3 and O4, then the FSMs for those separate expressions would the FSM 800 in FIG. 8A and the FSM 820 in FIG. 8B. However, applying the rule of step 530 leads to the conclusion that a single FSM can be used to compute both O3 and O4.

Figure 8A:
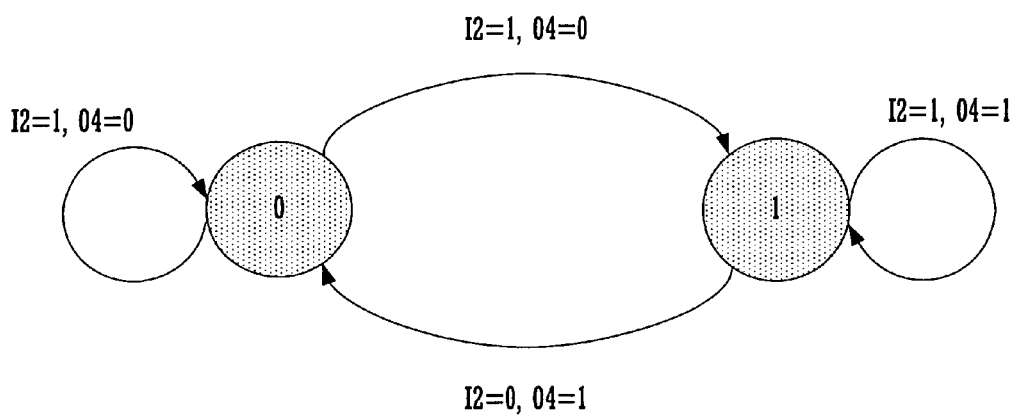
FIG. 8A and FIG. 8B are diagrams illustrating FSMs for computing two different outputs.
Figure 8B:
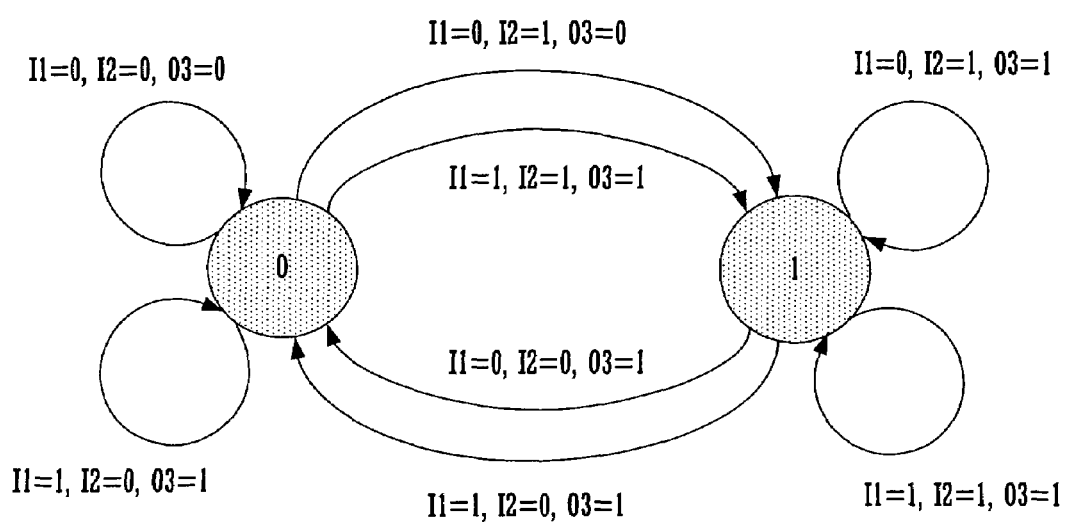
Figure 8C:
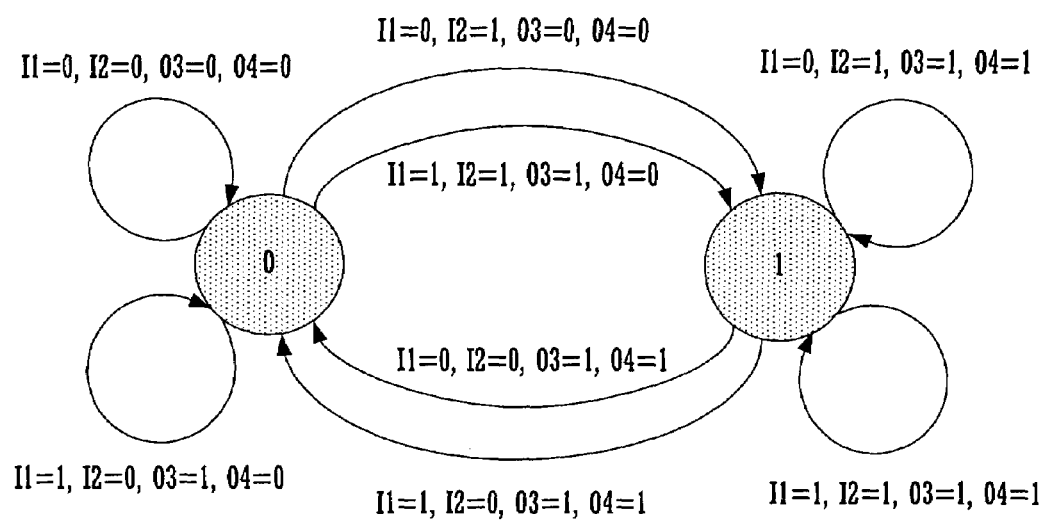
FIG. 8C is a diagram illustrating a single FSM for computing both outputs of the FSMs of FIG. 8A and FIG. 8B, in accordance with an embodiment of the present invention.

The FSM 850 in FIG. 8C represents the FSM 850 for computing the outputs O3 and O4 with a single FSM 850, in accordance with this embodiment of the present invention. Thus, instead of computing four states and 12 transitions, as depicted in FIGS. 8A and 8B, only two states and eight transitions are computed in the combined FSM 850 of FIG. 8C. This rule makes no hard guarantees with regards to the number of states and transitions of the combined FSM, except that the combined FSM will never be larger than the sum of the individual FSM and is very likely to be only "slightly" bigger than the largest of the individual FSMs.

If a step 530 determines that a single FSM is not to be computed for the two expressions currently being compared, process 500 proceeds to step 550 to determine if there are more expressions to compare. The process 500 repeats steps 505-530 until all expressions are compared. In step 560, the process 500 determines FSMs for all expressions for which FSMs have not yet been determined. For example, a separate FSM is determined for all expressions for which step 540 did not produce a FSM. Alternatively, a single FSM could be determined for all remaining expressions, if desired. However, it will be understood that the present embodiment is not limited by to any particular number of FSMs used to calculate the remaining expressions. The process 500 then ends.

Splitting FSM Based on Computer-Implemented Heuristics

Another embodiment of the present invention provides for a technique to split a FSM into multiple FSMs. The multiple FSMs may be input into a simulation tool. During execution of simulation, the output of one split of the FSM is used as an input of another split of the FSM. This embodiment allows for modeling of more complex computer architectures than might be possible without splitting, as the splitting can conserve computer system resources used to compute the FSMs, such as computer memory.

Figure 9:
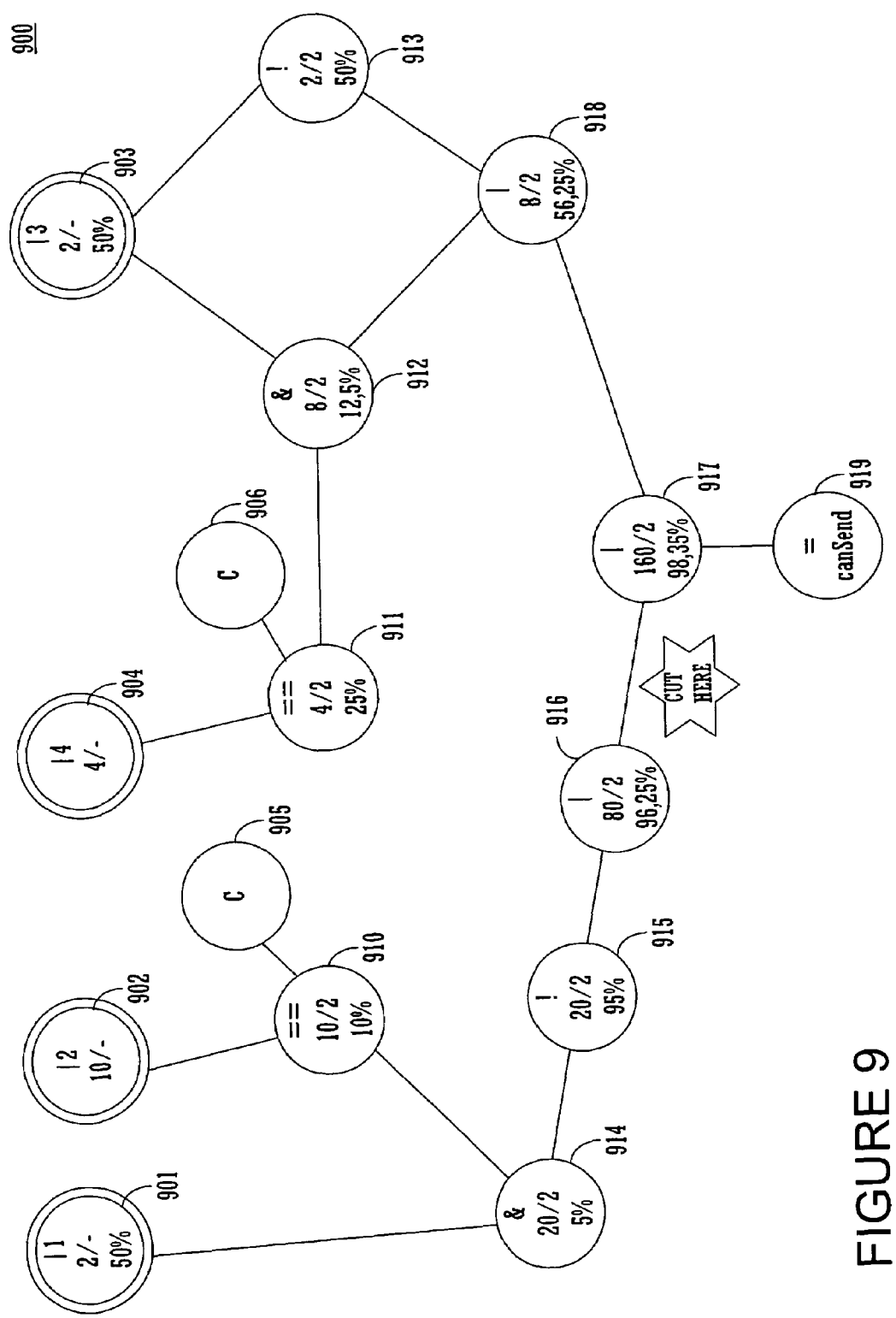
FIG. 9 is a diagram illustrating splitting of a dataflow graph, which results in splitting a FSM, in accordance with an embodiment of the present invention.
Figure 11A:
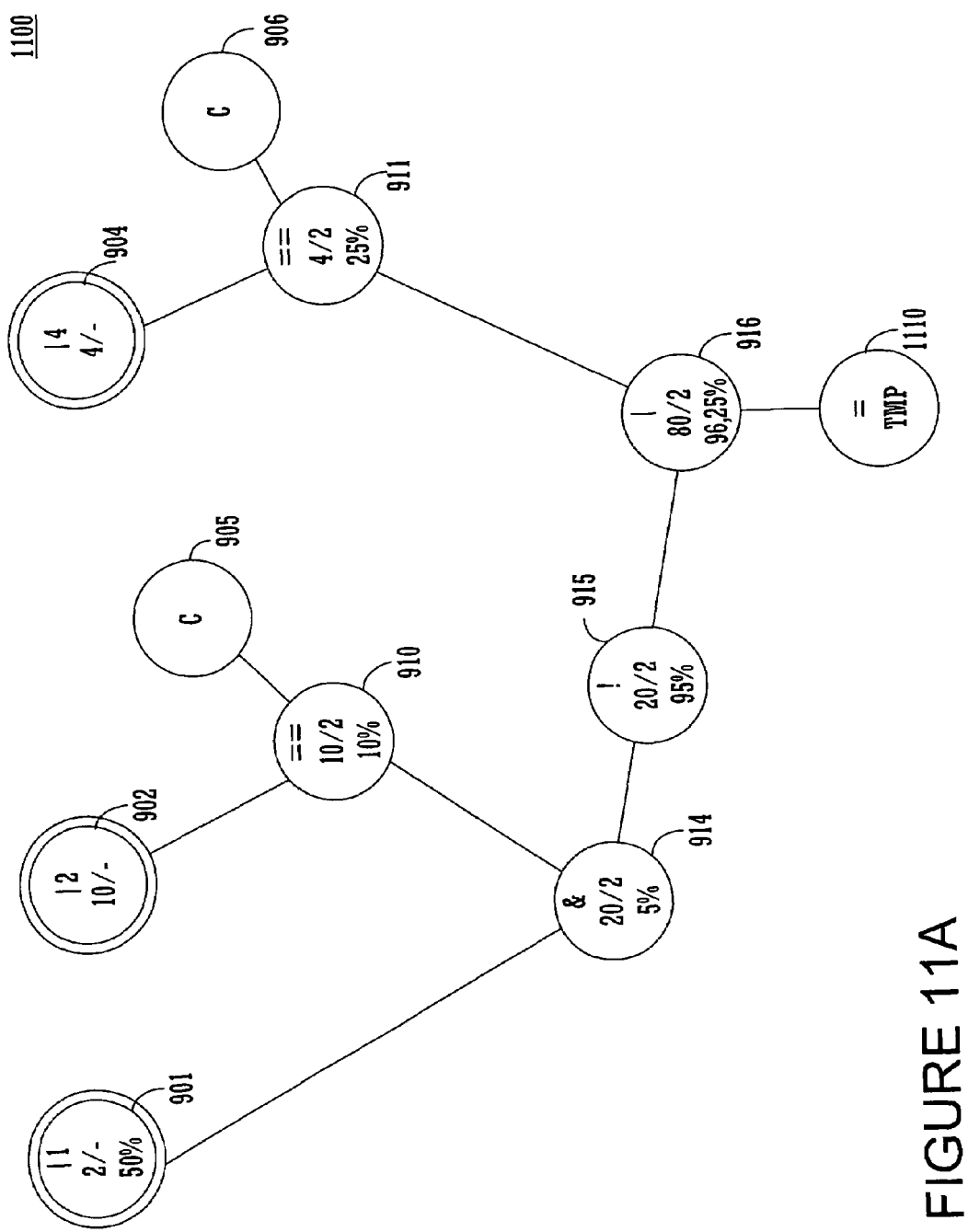
FIG. 11A and FIG. 11B are diagrams illustrating subsets of the dataflow graph depicted in FIG. 9, which was split in accordance with an embodiment of the present invention.
Figure 11B:
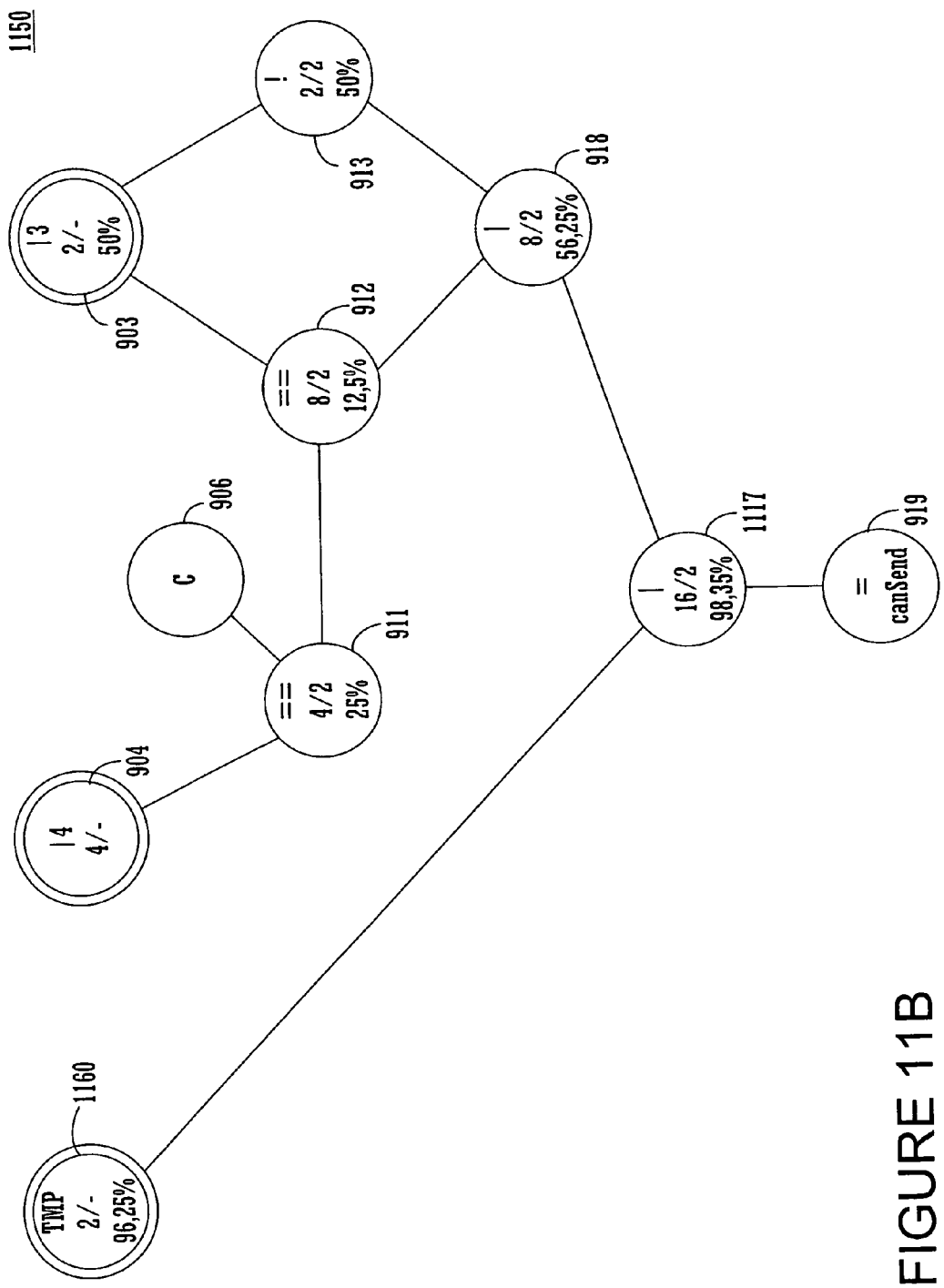
Figure 12:
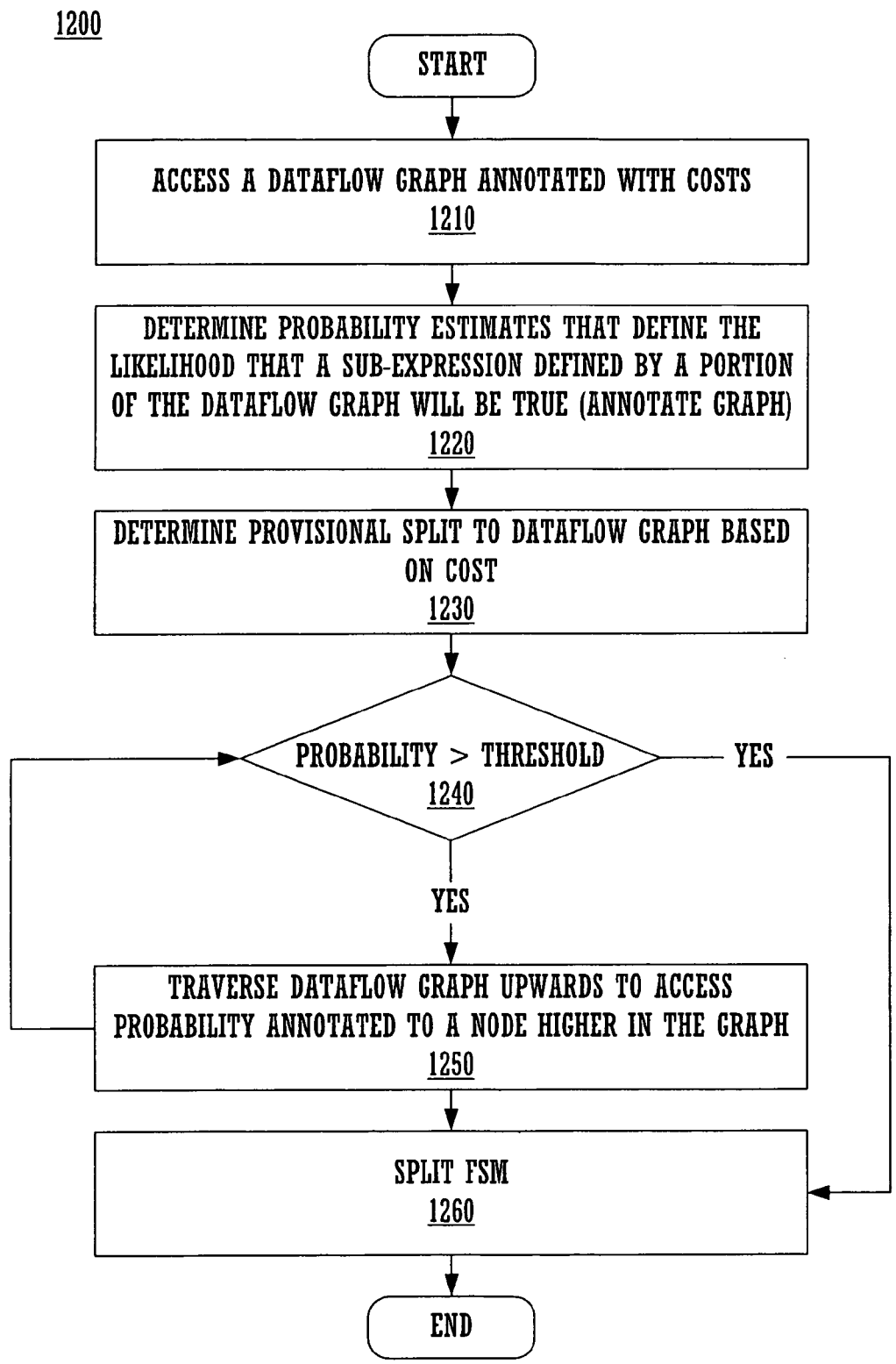
FIG. 12 is a flowchart illustrating steps of a process of splitting a dataflow graph applying heuristics, in accordance with an embodiment of the present invention.

FIG. 9 is a diagram illustrating splitting of a dataflow graph 900, which results in splitting a FSM, in accordance with an embodiment of the present invention. For example, a separate FSM is created for each portion of the dataflow graph 900 that exists after the dataflow graph 900 is split. FIGS. 11A and 11B are diagrams illustrating two portions (1100 and 1150, respectively) of the dataflow graph 900 after splitting, in accordance with an embodiment of the present invention. The dataflow graph 900 of FIG. 9 represents the following expression, wherein $I_1$, $I_2$, $I_3$, $I_4$ are inputs.

$$\text{canSend} = !(I_1 \& I_2 == 5) | I_4 == 3 | !I_3 | (I_3 \& I_4 == 3)$$

The output is "canSend," which indicates that data can be sent on the bus that is the subject of the formal protocol if the expression evaluates as true. The above expression may be one of many expression that are derived from a formal protocol specification of a computer architecture. Each variable and operator in the expression is represented by a node in the dataflow graph 900.

Figure 10:
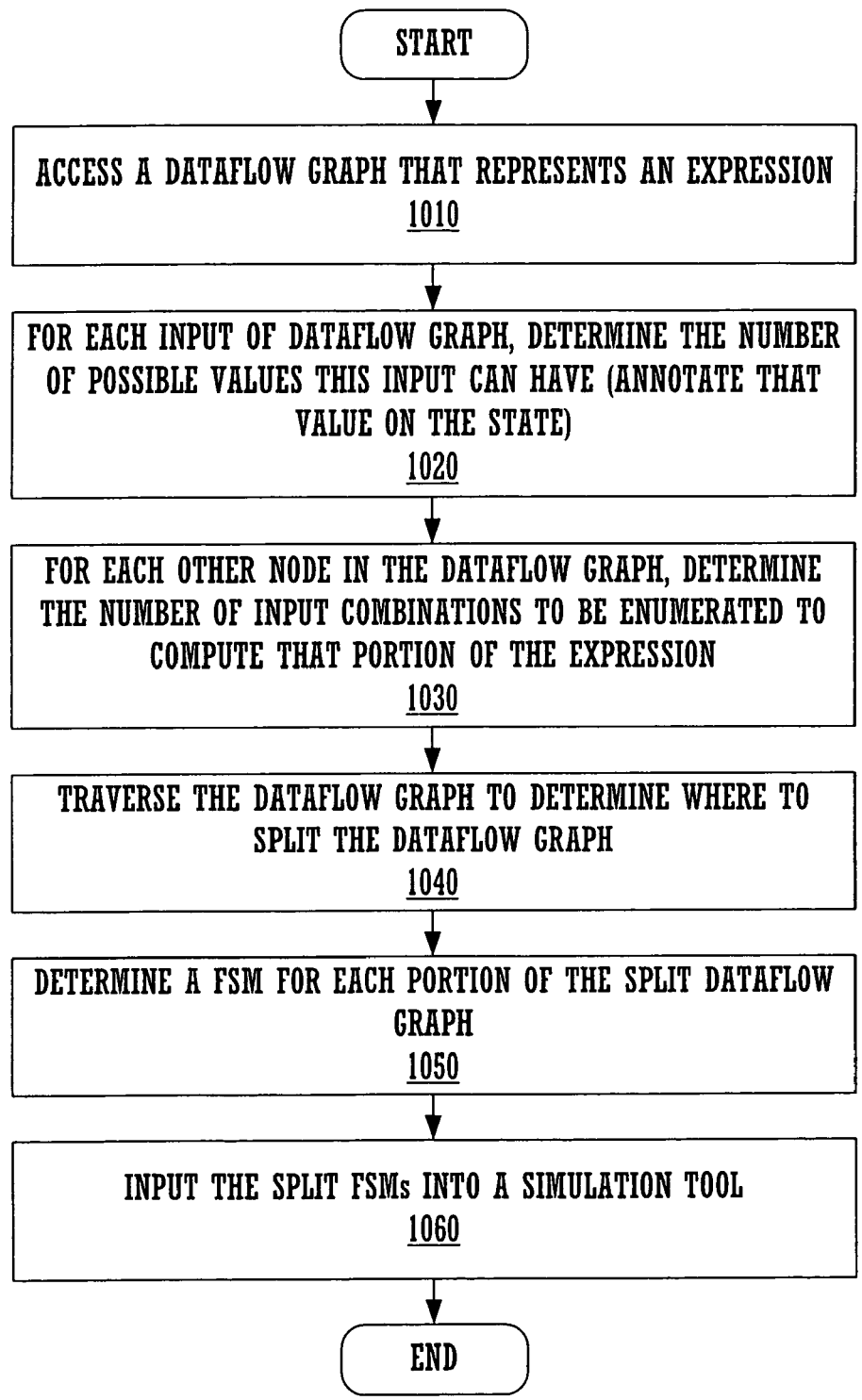
FIG. 10 is flowchart illustrating steps of a process of splitting a dataflow graph such that a FSM derived therefrom is split, in accordance with an embodiment of the present invention.

FIG. 10 is flowchart illustrating a process 1000 of splitting a dataflow graph such that a FSM derived therefrom is split into multiple FSMs, in accordance with an embodiment of the present invention. Steps of process 1000 may be stored as instructions on a computer readable medium and executed on a processor. Process 1000 of FIG. 10 will be discussed in conjunction with the dataflow graphs depicted in FIGS. 9, 11A, and 11B. Step 1010 is accessing a dataflow graph that represents an expression. The dataflow graph may have been created by accessing an input specification of a computer architecture, deriving a number of expressions that are suitable to implement the input specification, and creating a dataflow graph for each of the expressions.

In step 1020, for each input, the number of possible values this input can have is determined and annotated on that input node. For example, if $I_1$ is a Boolean variable, then "2/-" is annotated on the node 901 representing $I_1$. The input $I_2$ can have 10 possible values and hence node 902 is annotated "10/-." Nodes 903 and 904 are for inputs I3 and I4, respectively. There are two constant inputs in the dataflow graph, as reflected in nodes 905 and 906.

In step 1030, for each other node (910-917) in the graph 900 except the final canSend node 919, the number of input combinations to be enumerated in order to compute the portion of the expression are annotated on the node. Also annotated on those nodes 910-917 are the number of possible values for that node. For example, the node 910, which represents the sub-expression "$I_2==5$" in the overall expression is annotated with "10/2", since this node 910 uses only input $I_2$ (which has 10 possible values) and yields a true or false value. The computation of the canSend, requires enumeration of 160 input combinations (e.g., 2*1*2*4). Together, steps 1020 and 1030 constitute performing a cost analysis of computing sub-expressions of the expression corresponding to subsets of the dataflow graph.

In step 1040, the dataflow graph 900 is traversed to determine where to spilt the dataflow graph 900. The determination is based on whether the cost annotated on a node is greater than a threshold value. For example, if the threshold value is 50, then the cost of the last "OR" operation at node 917 (160/2=80) exceeds the threshold. Because this node 917 represents a binary operation, the cut can be made on either the left hand side argument or the right hand side argument. In order to get the maximum benefit, the cut is made on the side with the argument that has the highest cost, which in this case is the left hand side argument.

The threshold value may be a pre-determined value. Alternatively, The threshold value may based on user input. Furthermore, the threshold value may be adjusted by the computer program that executes process 1000.

Applying this split results in the two dataflow diagrams 1100 and 1150 depicted in FIGS. 11A and 11B respectively illustrating subsets of the dataflow graph 900 depicted in FIG. 9, which was split in accordance with an embodiment of the present invention. Note that the cost of enumerating the FSM from the first split graph 1100 of FIG. 11A is 80 input combinations, as indicated at node 916. The cost of enumerating the FSM from the second dataflow graph 1150 of FIG. 11B is 16 input combinations, as indicated at node 1117. Therefore, to compute both split FSMs of FIGS. 11A and 11B, the FSM generator (FIG. 1, 136) now only has to enumerate 80+16=96 input combinations. In order to compute the non-split FSM from the dataflow graph 900 of FIG. 9, the FSM generator 136 would have to enumerate 160 input combinations. Reducing the number of input combinations not only reduces the size of the resulting FSMs, but it also speeds up the computation of those FSMs dramatically.

In step 1050, the FSMs for the dataflow diagrams in FIGS. 11A and 11B are generated and output. The split FSMs may be stored on a computer readable medium.

In step 1060, the split FSMs are input to a simulation tool. During execution of the simulation, the output 1110 of the first FSM 1100 of FIG. 11A ("TMP") serves as an input 1160 to the second FSM 1150 of FIG. 11B. The effect on the second FSM 1150 is that where "TMP" represented 80 input combinations in the non-split FSM 900, it only represents two input combinations in the split FSM 1150 of FIG. 11B. Process 1000 then ends.

Various nodes in the dataflow diagrams in FIGS. 9, 11A, and 11B are also annotated with a probability. This is the probability that the portion of the expression represented by a subset of the dataflow graph will be true. For example, node 914 in FIGS. 9 and 11A represents the sub-expression "!($I_1$ & $I_2$==5)." The probability may that this sub-expression will be true may be estimated as 5%, which is based on an estimate that the Boolean input "$I_1$" has a 50% probability of being true and the input "$I_2$" will equal the constant value of "5" with a 10% probability. The estimate of the probability may be arrived at by more complex techniques. For example, it is not required to estimate the Boolean input $I_1$ will be true 50% of the time. Moreover, while the previous discussion assumes that inputs are independent and its values are evenly distributed, this is not required.

The probability values are not required for the embodiment of process 1000 in FIG. 10. In order to provide even greater efficiency, an embodiment of the present invention applies a probabilistic heuristic when cutting a dataflow graph 900 of FIG. 9 to spilt a FSM. Referring to FIG. 11B, it is noted that the estimated probability that the node TMP 1160 is true is 96.25%. Recalling that the node TMP 1160 is an input to the second FSM 1150 of FIG. 11B, this means that it is estimated that 96.25% of the time the input from the first FSM 1100 of FIG. 11A to the second FSM 1150 of FIG. 11B will be true. This is referred to as interFSM communication. In the present embodiment, the probability of interFSM communication is factored into the decision of where to cut the original FSM 900 of FIG. 9. This embodiment reduces the probability that interFSM communication occurs.

Process 1200 describes steps in a process of splitting a dataflow graph applying heuristics, in accordance with an embodiment of the present invention. This embodiment may reduce the probability that interFSM communication occurs. Process 1200 may be implemented after steps of 1000 are performed. In step 1210, a dataflow graph that is annotated with costs is accessed. For example, a dataflow graph that is processed in accordance with steps 1010-1030 of process 1000 is accessed.

In step 1220, probability estimates are determined that define the likelihood that a sub-expression defined by a portion of the dataflow graph will be true. The nodes of the dataflow graph are annotated with the probability estimate.

In step 1230, a node that represents a provisional splitting point is determined. The provisional splitting point is based on the cost, but the probability estimate is not yet used. As with process 1000, the split may be performed on either side of the node, in accordance with a preferred criterion.

In step 1240, the probability value annotated to the node of the provisional spilt is accessed to determine whether the probability is greater than a threshold value. If the probability is not greater than the threshold, this indicates that the probability of interFSM communication during simulation is acceptable. Thus, the process 1200 continues to step 1260 wherein the dataflow graph is split. If the probability is greater than the threshold, this indicates that the probability of interFSM communication during simulation is higher than desired.

Thus, if the probability is greater than the threshold, then step 1250 is taken in which the dataflow graph is traversed upwards from the provisional splitting point to access the probability annotated to another and step 1240 is repeated until a node is found with a probability that is less than a given threshold value. Then the process 1200 continues to step 1260 wherein the dataflow graph is split. The process 1200 then ends.

Constraint Relaxation

As discussed herein, computing FSMs more efficiently can be beneficial in allowing more complex computer architectures (e.g., computer busses) to be modeled or simulated. As also discussed herein, FSMs may be derived from expressions that reflect conditions of an input specification. The expressions may comprise mathematical operators and integers, including Boolean variables and operators. However, the expressions are not so limited. For example, the expressions may contain real numbers.

It is possible to simplify the FSM for computing the output of a first expression by receiving a second expression (e.g., an enable expression) that defines conditions for a variable in the first expression to be true. This in turn allows the FSM that computes the first expression to potentially be simpler. However, the enable expression can be very complex. If a very complex enable expression is strictly adhered to, the computation of the FSM for the first expression can actually be hindered by using the enable expression.

An embodiment of the present invention relaxes the constraints on expressions such that an expression can be simplified. The simplification may result in one or more variables being removed from the expression. One application of relaxing constraints on expressions is to create FSMs more efficiently. For example, an enable expression is relaxed to simplify the enable expression. Then, the simplified enable expression is used in the determination of a FSM that computes the output of an expression to which the enable expression relates. It will be understood that the embodiment for relaxing constraint expressions is not limited to applications that derive FSM from expressions. Those of ordinary skill in the art will understand that other useful applications exist for removing variables from expressions.

To illustrate principles of an embodiment of the present invention, consider a Boolean expression E1 using variables V1 . . . Vn. The present embodiment determines an expression E2 that uses the variables V1 . . . V(n−1) such that a correctness criterion holds. The correctness criterion is defined as follows: for all cases in which E1 evaluates as true, the simplified expression E2 evaluates as true. However, the simplified expression E2 may evaluate as true for a case in which E1 does not.

For example, suppose E1 is "V1 & V2" (where & stands for the Boolean AND operator). In order to remove V2 from the expression, we can say E2 is "V1". From the truth table (TABLE I), we can derive that the correctness criterion is satisfied. For example, all the rows (only row four in this case) where there's a "1" for E1 also has a "1" for E2, which means the correctness criterion is satisfied.

TABLE I

| V1 | V2 | E1 | E2 |
|----|----|----|----|
| 0  | 0  | 0  | 0  |
| 0  | 1  | 0  | 0  |
| 1  | 0  | 0  | 1  |
| 1  | 1  | 1  | 1  |

Optionally, another criterion is followed. This criterion strives to reduce the number of cases in which E2 evaluates to "true" where E1 is not true. For example, E2 also has a '1' in row three of Table I, whereas E1 does not. This is acceptable, but less than ideal. However, given the nature of the constraint, there is no possible solution that does not have at least one extra '1' for E2. Therefore, this solution reduces the number of cases in which E2 evaluates to "true" where E1 is not true. In one embodiment, the reduction provides the fewest number of cases in which E2 evaluates to "true" where E1 is not true. However, providing the fewest number of cases in which E2 evaluates to "true" where E1 is not true is not a requirement.

Figure 13:
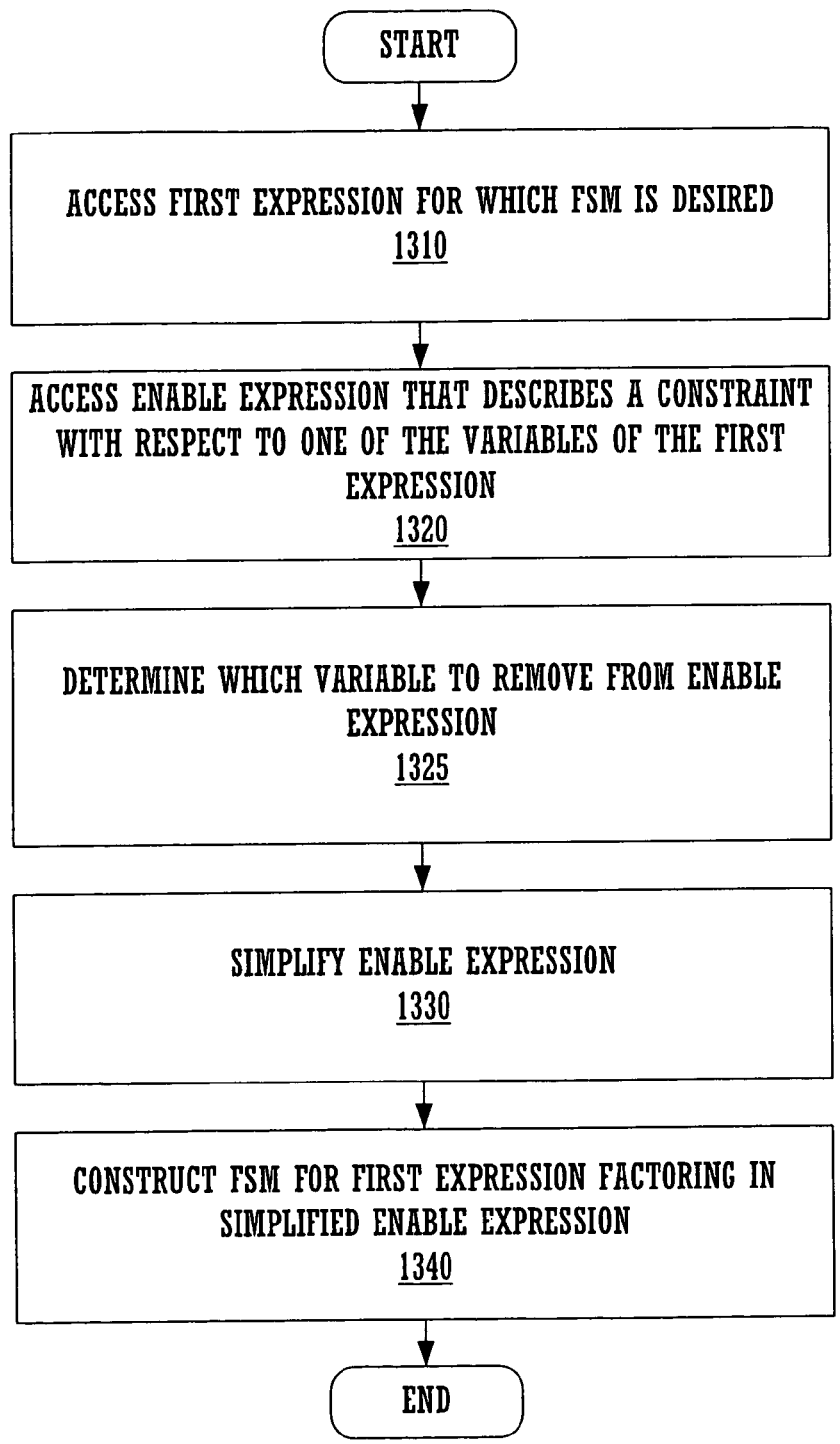
FIG. 13 is flowchart illustrating steps of a process of calculating a state machine using constraint relaxation, in accordance with an embodiment of the present invention.

FIG. 13 is flowchart illustrating a process 1300 of calculating a state machine using constraint relaxation, in accordance with an embodiment of the present invention. In step 1310, a first expression is accessed. This expression is one for which a FSM that is desired. As a simple example, the expression for which the FSM is desired may be "O=x & y." For example, the output is true if the Boolean variables x and y are each true. Note that there are four possible input combinations of the two Boolean inputs. The number of input combinations affects the size of the FSM and the time to compute the FSM.

In step 1320, a second Boolean expression is accessed that describes a constraint with respect to one of the variables of the first Boolean expression. The second expression may be referred to as an enable expression and may be created by a user. For example, the second expression may be a user-provided constraint upon "x." For example, the second expression may be "e=y & (z=5)." Thus in this illustration, the enable expression has an integer input "z." Note, however, that z is not necessary to compute the output.

In step 1325, a determination is made as to which variable to eliminate from the second expression (e.g., from the enable expression). The enable expression that the user provides may be more complex than desired. For example, the user-provided expression includes a "z=5" term. This means that, whereas the original expression "O=x & y" had four input combinations, factoring in the input "z" dramatically increases the number of possible input combinations. For example, if "z" is an integer with, for example, ten possible values this means that computing the original expression "O=x & y" using the enable expression could potentially have 40 inputs. Therefore, the enable expression is simplified by this embodiment of the present invention to eliminate one of the variables. In this simple example, the variable "z" is eliminated because it is not a necessary variable to compute the original expression "O=x & y." In practice, the enable expression provided by a user may be so complex that it is very difficult for the user to recognize that the enable expression contains a variable that is not in the original expression.

In step 1330, the second Boolean expression is simplified. Step 1330 may comprise normalizing the expression and relaxing the expression. Process 1400 of FIG. 14 illustrates an embodiment for normalizing an expression and relaxing a constraint in the expression.

Figure 17A:
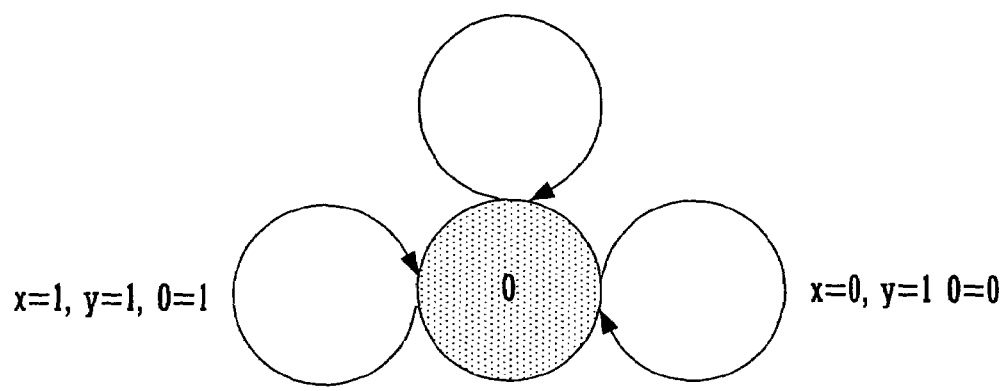
FIG. 17A is a diagram illustrating simplifying a state machine, in accordance with an embodiment of the present invention.
Figure 17B:
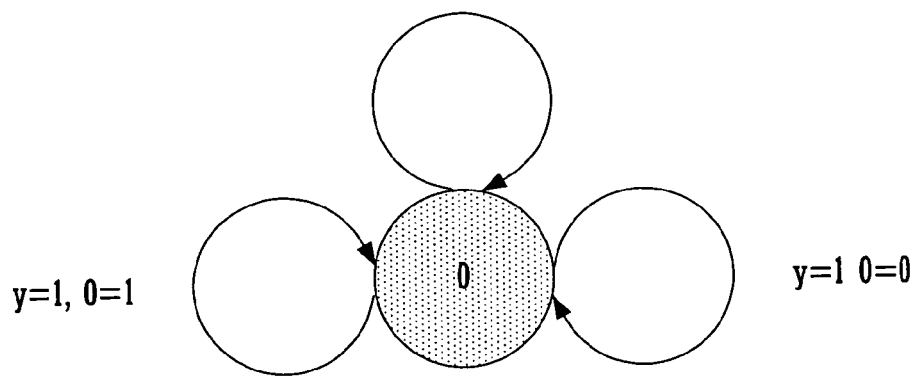
FIG. 17B is a diagram illustrating a state machine that was simplified in accordance with an embodiment of the present invention.

In step 1340, a FSM is determined for the first expression based on the simplified enable expression. The result may be that at least one of the plurality of input combinations for the FSM is eliminated based on the constraint. For example, referring to the FSM 1700 FIG. 17A, the original expression, "O=x & y" has a single state with four transitions. However, the transition labeled "x=1, y=0, O=0" is not a valid transition because x cannot be 1 when y is 0 according to the simplified enable expression. Therefore, referring to the FSM 1750 FIG. 17B, the number of transitions is reduced by one in this case. The FSM is output and may be stored on a computer readable medium. The FSM may be used in the simulation of a computer architecture, a part of which was specified by the first expression that was accessed in step 1310.

Figure 14:
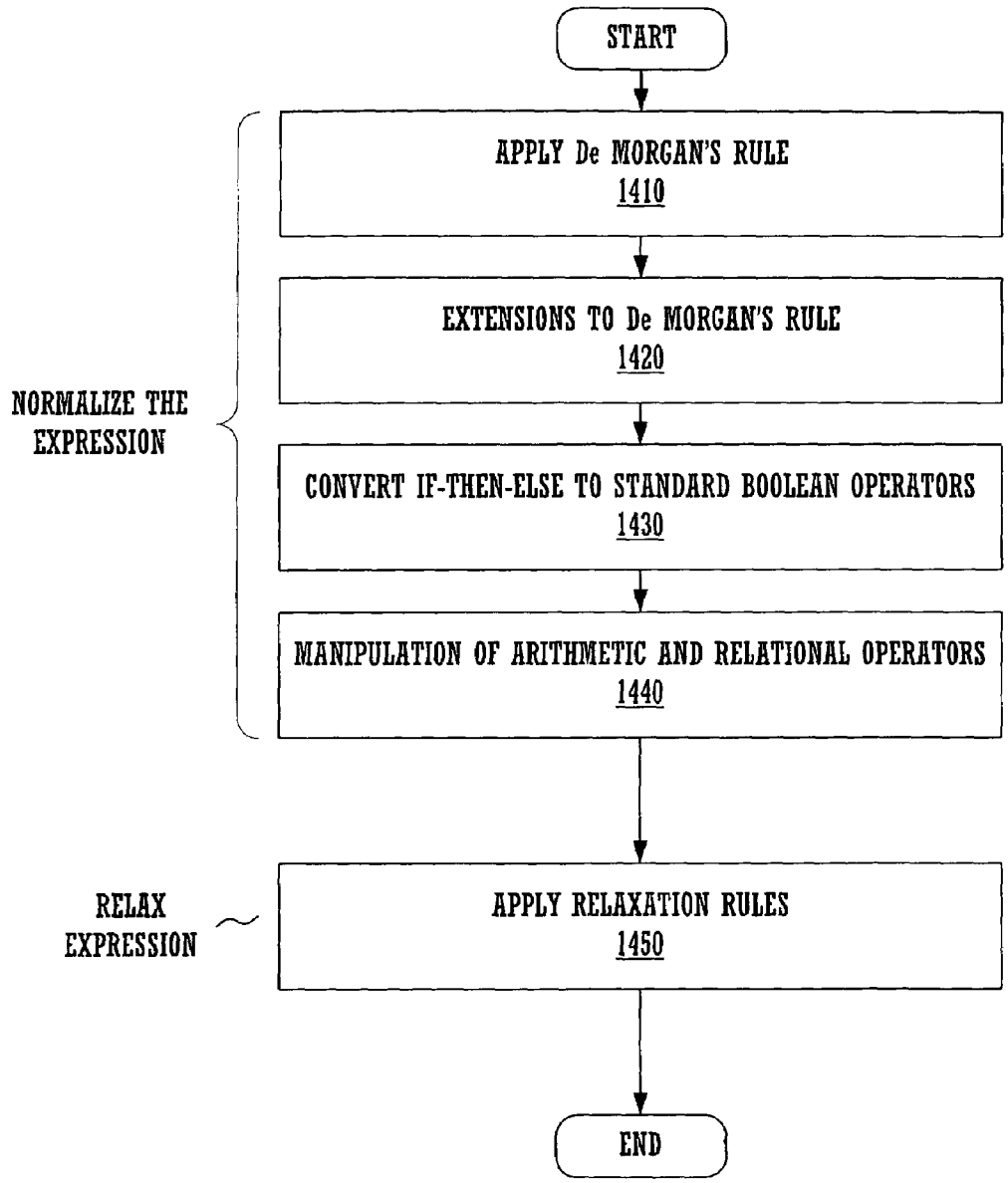
FIG. 14 is flowchart illustrating steps of a process of applying rules to simplify an expression, in accordance with an embodiment of the present invention.

FIG. 14 is flowchart illustrating a process 1400 of applying rules to simplify an expression, in accordance with an embodiment of the present invention. The overall process 1400 is divided into two stages, normalization and relaxation. In steps 1410-1440 a set of rules are applied to put the input expression (E1) into a "normal form". The normal form is equivalent to E1 in the sense that its truth table is identical to E1's truth table. The relaxation stage is applied after the expression is in its normal form. For the purpose of illustration of process 1400, A, B, C and D are Boolean variables, X, Y and Z are integer variables. The variable I is used to denote the Boolean variable that is to be removed from the expression, while variable J is used to denote the integer variable that should be removed from the expression. In these expressions, the variables could be inputs or expressions themselves. In step 1410, the "Laws of De Morgan" are applied to input expression E1. These laws may be stated as follows.

$$!(A \& B) ==> !A | !B$$

$$!(A | B) ==> !A \& !B$$

$$!!A ==> A$$

In step 1420, extensions of De Morgan's laws are applied for the other operators. For example, De Morgan's laws only cover the standard Boolean operators !, & and |. However, step 1420 applies to other cases. Following are exemplary additional cases. However, the present embodiment is not limited to these cases.

$$!(A == B) == A != B$$

$$!(A != B) ==> A == B$$

$$!(A >= B) ==> A < B$$

$!(A<=B)==>A>B$ $!(A>B)==>A<=B$ $!(A<B)==>A>=B$

In step 1430, if-then-elses are converted to standard Boolean operators. For example, the following rule is applied to if-then-elses within expression E1.

if $A$ then $B$ else $C==>(A \& B)|(!A \& C)$

In step 1440, manipulations are performed on arithmetic and relational operators. For example, arithmetic and relational operators are only applied on inputs or on the ! operator or on the delay operator or on arithmetic sub-expressions or on relational sub-expressions. Step 1440 may be illustrated by the following exemplary rules. It will be understood that this list is non-exhaustive.

$(A|B)==(C|D)==>((A|B) \& (C|D))|(!A \& !B \& !C \& !D)$ $(A\&B)==(C\&D)==>(A \& B \& C \& D)|((!A|!B) \& (!C \& !D))$ $(A|B)==\text{false}==>!A \& !B$ $(A|B)==\text{true}==>A|B$ $(A\&B)==\text{false}==>!A|!B$ $(A\&B)==\text{true}==>A\&B$ $((A|B)+D)==C==>((A|B) \& (1+D==C))|((!A\&!B) \& (D==C))$ In step 1450, relaxation rules are applied to the normal form of expression E1. Exemplary relaxation rules are as follows. It is not required that all rules on this list be applied. Moreover, the present embodiment is not limited to the following exemplary relaxation rules.

1. A|I==>true
2. A & I==>A
3. A==I==>true ['==' can be replaced by any relational operator]
3. X==J==>true ['==' can be replaced by any relational operator]
4. X+J==>I ['+' can be replaced by any arithmetic operator]
5. !I==>I
6. I==>I
7. J==>J As an example, applying process 1400 to the following expression can be used to remove the Boolean variable I from the following expression.

$X==(\text{if } I \text{ then } Y \text{ else } 3)+(\text{if } A \text{ then } 4 \text{ else } Z)$ The resulting simplified expression is given as follows:

$(A \& X==Y+4|!A \& X==Y+Z)|(A \& X==3+4|!A \& X==3+Z)$

Collapsing Finite State Machines

Another embodiment of the present invention collapses two states in a FSM to a common state. This embodiment is practiced after the FSM is created and is applicable to very large scale FSMs. This embodiments first collapses states near the end of the FSM, then works backwards in the FSM. This allows states earlier in the FSM to be collapsed that would not otherwise be collapsible.

Figure 15A:
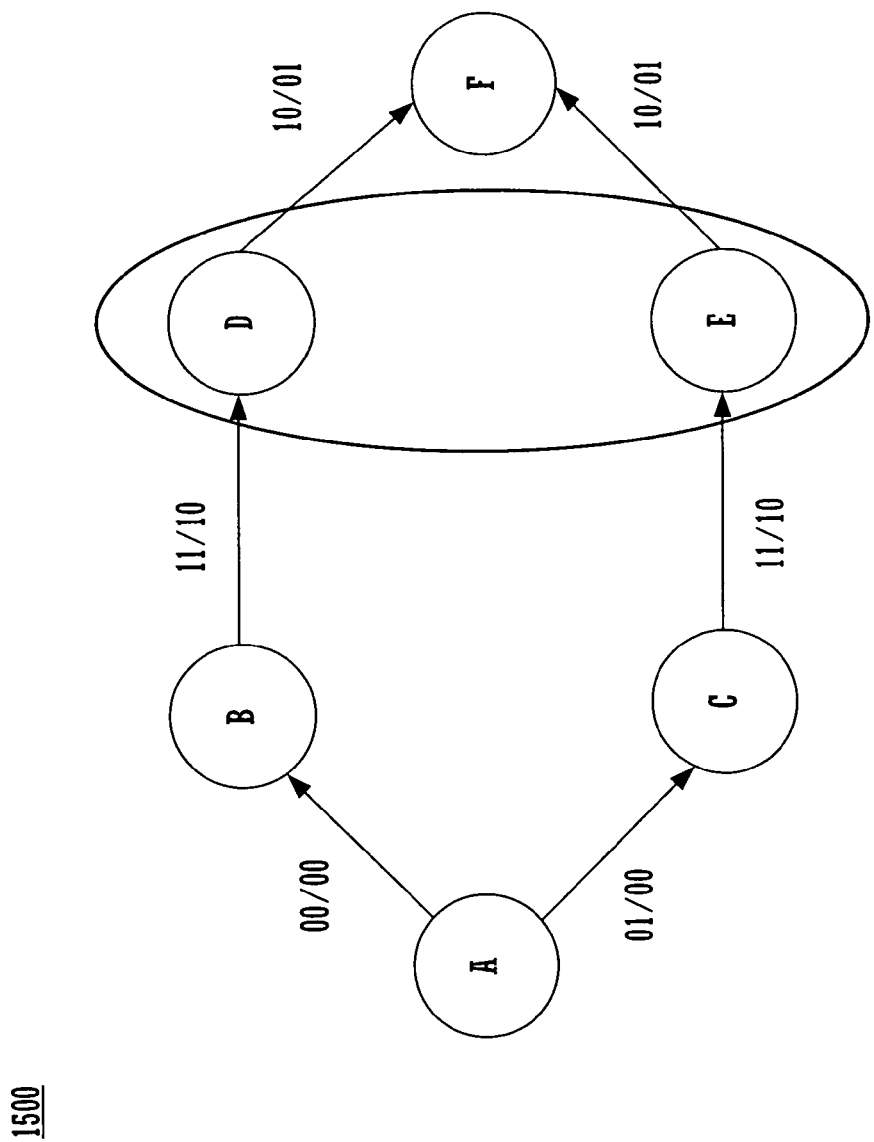
FIG. 15A, FIG. 15B, and FIG. 15C are diagrams of a finite state machine illustrating collapsing states, in accordance with an embodiment of the present invention.

Referring to the FSM 1500 of FIG. 15A, states D and E are identified as collapsible because their inputs are identical ("10"), their outputs of are identical ("01"), and they transition to the same state (F).

Figure 15B:
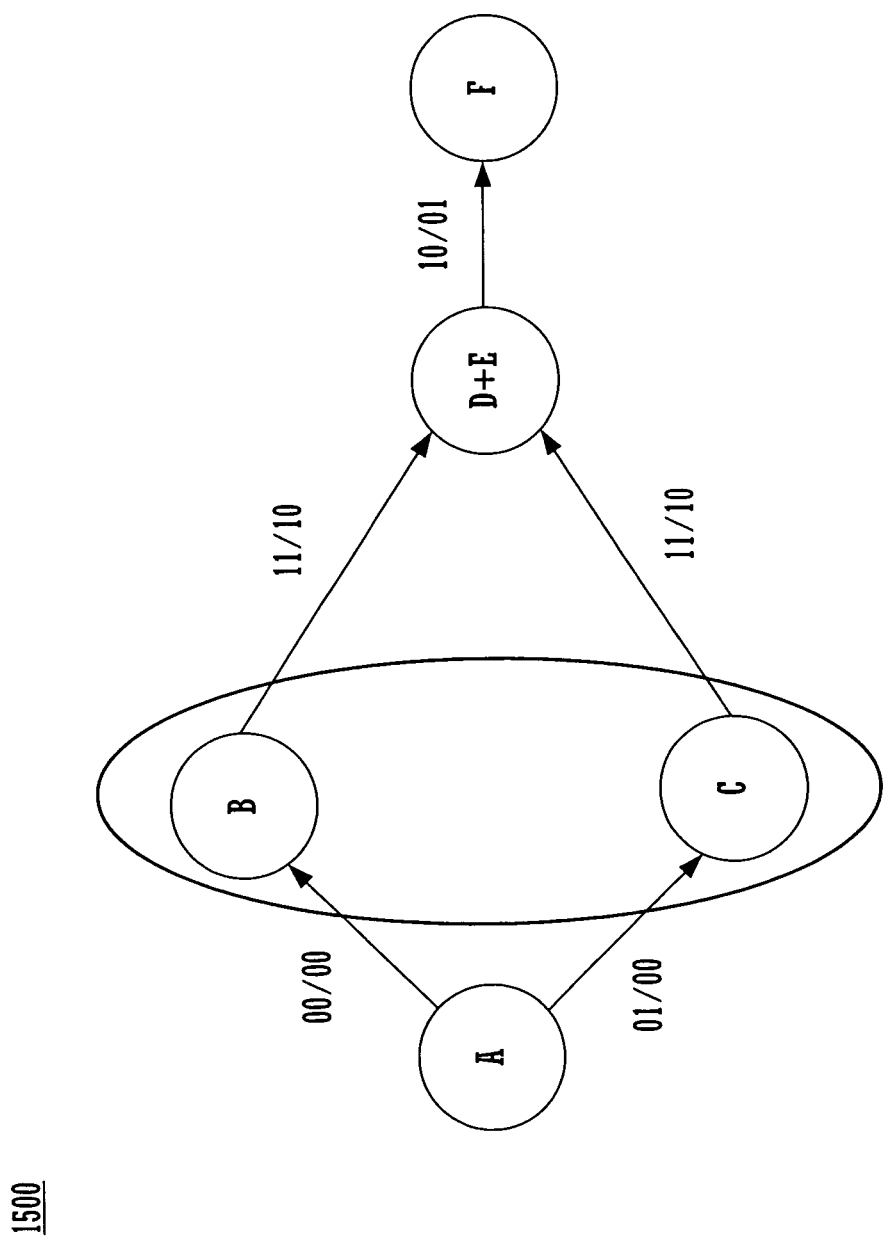
Figure 15C:
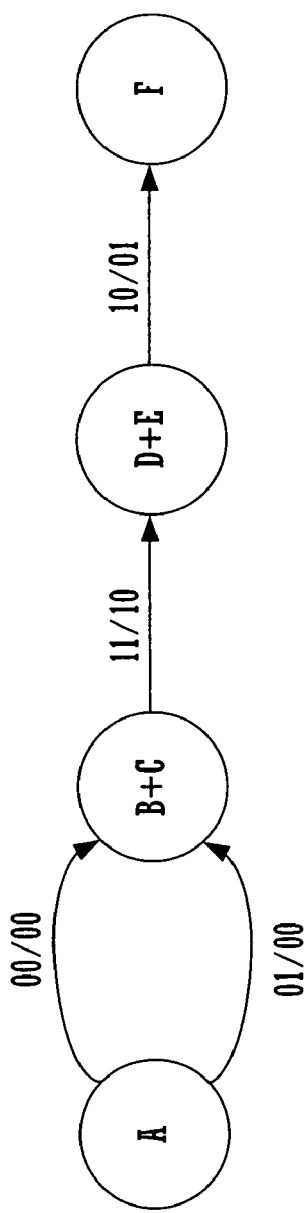

Referring to the FSM 1500 of FIG. 15B, states D and E are collapsed to a common state (D+E). Furthermore, states B and C are identified as collapsible because their inputs are identical ("11"), their outputs of are identical ("10"), and they transition to the same state (D+E). Note that while states B and C can also be collapsed, this is predicated upon determining that states D and E are equivalent before B and C are processed. FIG. 15C illustrates the FSM 1500 after collapsing states B and C to state B+C.

Referring to FIG. 15B, the outputs of state A are "00", and inputs to state A are either "00" or "01". For inputs "00" assume that x=0 and y=1, but for input "01" that x=1 and y=1. This results in state B and C being initially generated because the bus state is different for the two states. However, the fact that the variables x and y are different turns out to be immaterial. Note that after collapsing states B and C, the value of y is not specified. However, this is not relevant because all outgoing transitions from states B and C are the same.

Figure 16:
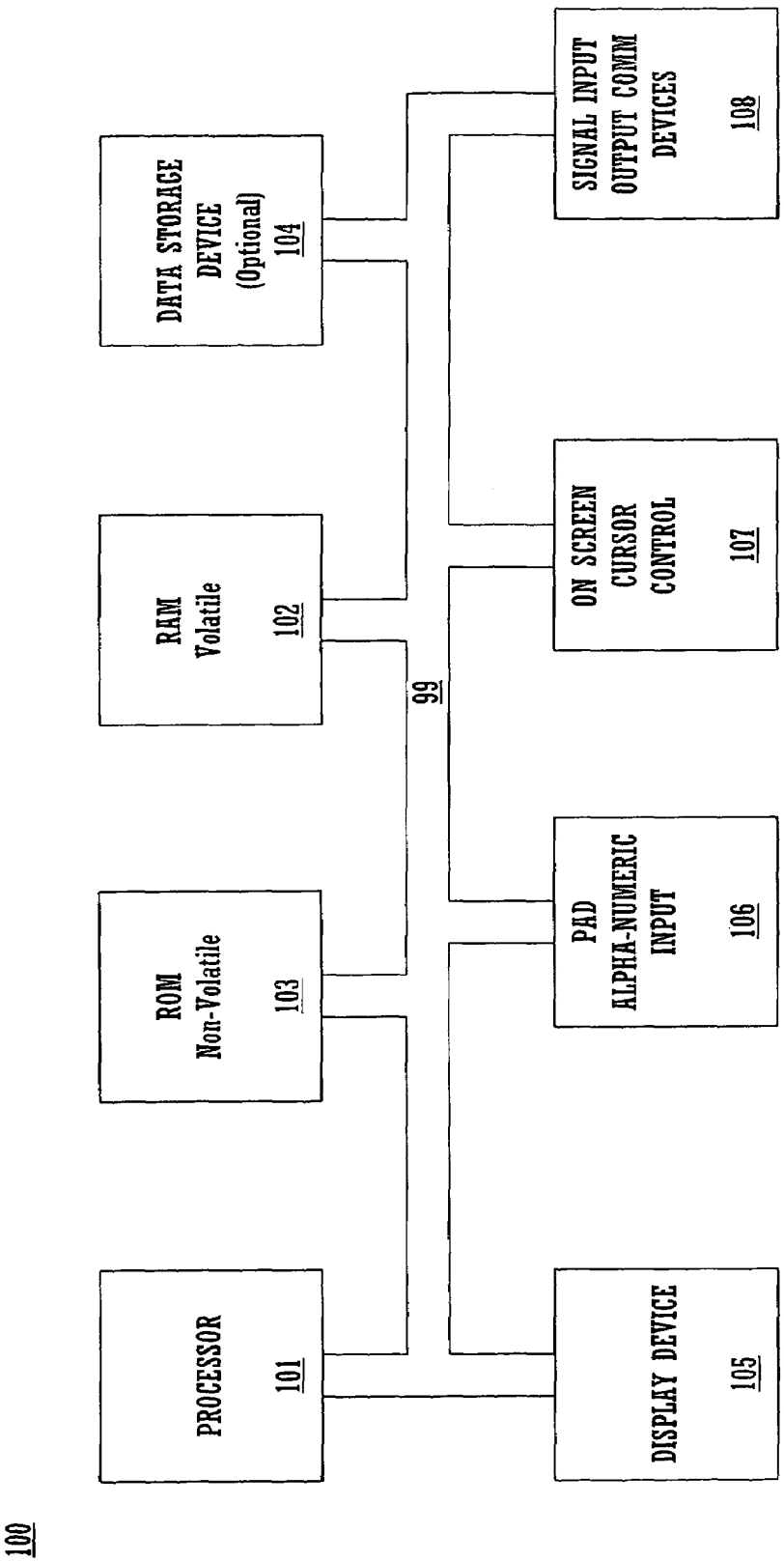
FIG. 16 is an exemplary computer system that may serve as a platform upon which embodiments of the present invention may be executed.

FIG. 16 illustrates circuitry of an exemplary computer system 100, which may form a platform for embodiments of large-scale FSMs. For example, computer system 100 may form a platform for the bus compiler 120 of FIG. 1. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 16 system 100 also includes an alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, large-scale finite state machines, is thus described. While the present invention has been described in particular embodiments, it should be appreciated that the present invention should not be construed as limited by such embodiments, but rather construed according to the below claims.

What is claimed is:

1. A computer implemented method of determining finite state machines, comprising:

accessing, via a computer system, a dataflow graph that represents an expression, wherein each variable and operator in the expression is represented by a node in the dataflow graph;

performing a cost analysis of computing sub-expressions of the expression corresponding to subsets of the dataflow graph;

determining probabilities that ones of the sub-expressions evaluates as true based on input values to respective ones of the sub-expressions;

splitting the dataflow graph into a plurality of dataflow graphs based on the respective cost for each of the sub-expressions and the probabilities that ones of the sub-expressions evaluates as true; and determining a plurality of finite state machines corresponding to said plurality of dataflow graphs.

2. The method of claim 1, further comprising:

combining said plurality of finite state machines during a simulation by using an output of a first of said plurality of finite state machines as an input to a second of said plurality of finite state machines.

3. The method of claim 1, wherein said performing comprises determining whether a cost of calculating a finite state machine for a subset of the dataflow graph is greater than a threshold value.

4. The method of claim 3, wherein said threshold value is a pre-determined value.

5. The method of claim 3, wherein said threshold value is input from a user.

6. The method of claim 3, wherein said threshold value is adjustable.

7. The method of claim 1, wherein said performing comprises:

determining a number of input values that are possible for each input node of the dataflow graph;

determining a number of possible combinations of said input values that exist for each of said sub-expressions;

determining a number of possible output values that exist for each of said sub-expressions; and determining a cost for each of the sub-expressions based on the possible combinations of the input values and the output values.

8. The method of claim 1, wherein said splitting the dataflow graph into a plurality of dataflow graphs based on the respective cost for each of the sub-expressions and the probabilities that ones of the sub-expressions will be true comprises determining whether a probability that one of the sub-expressions evaluates as true is below a threshold percentage.

9. The method of claim 1, further comprising collapsing multiple states to a single state in ones of said finite state machines by merging states that transition to a common state and for which inputs and outputs are identical.

10. The method of claim 9, further comprising traversing said ones of said finite state machines from end to start to collapse additional states.

11. A system comprising a processor and a computer readable medium coupled to a bus, wherein said computer readable medium has stored thereon instructions that when executed on said processor implement a method for determining finite state machines for a dataflow graph, said method comprising:

accessing a dataflow graph that represents an expression, wherein each variable and operator in the expression is represented by a node in the dataflow graph;

performing a cost analysis of computing sub-expressions of the expression corresponding to subsets of the dataflow graph;

determining probabilities that ones of the sub-expressions evaluates as true based on input values to respective ones of the sub-expressions;

splitting the dataflow graph into a plurality of dataflow graphs based on the respective cost for each of the sub-expressions and the probabilities that ones of the sub-expressions evaluates as true; and determining a plurality of finite state machines corresponding to said plurality of dataflow graphs.

12. The system of claim 11, wherein said method further comprises:

combining said plurality of finite state machines during a simulation by using an output of a first of said plurality of finite state machines as an input to a second of said plurality of finite state machines.

13. The system of claim 11, wherein said performing comprises determining whether a cost of calculating a finite state machine for a subset of the dataflow graph is greater than a threshold value.

14. The system of claim 13, wherein said threshold value is a pre-determined value.

15. The system of claim 13, wherein said threshold value is input from a user.

16. The system of claim 13, wherein said threshold value is adjustable.

17. The system of claim 11, wherein said b) of said method comprises:

determining a number of input values that are possible for each input node of the dataflow graph;

determining a number of possible combinations of said input values that exist for each of said sub-expressions;

determining a number of possible output values that exist for each of said sub-expressions; and determining a cost for each of the sub-expressions based on the possible combinations of the input values and the output values.

18. The system of claim 11, wherein said splitting the dataflow graph into a plurality of dataflow graphs based on the cost for each of the sub-expressions and the probabilities that ones of the sub-expressions will be true comprises determining whether a probability that one of the sub-expressions will be true is below a threshold percentage.

19. The system of claim 11, wherein said method further comprises collapsing multiple states to a single state in ones of said finite state machines of said method by merging states that transition to a common state and for which inputs and outputs are identical.

20. The system of claim 19, wherein said method further comprises traversing said ones of said finite state machines from end to start to collapse additional states.

* * * * *